US009723756B1

(12) United States Patent
Masters et al.

(10) Patent No.: US 9,723,756 B1
(45) Date of Patent: Aug. 1, 2017

(54) RACK MOUNTING PORTION ASSEMBLY

(71) Applicant: Amazon Technologies, Inc., Reno, NV (US)

(72) Inventors: Mallory Leigh Masters, Ashburn, VA (US); Kraig Knight, Ashburn, VA (US)

(73) Assignee: Amazon Technologies, Inc., Reno, NV (US)

( * ) Notice: Subject to any disclaimer, the term of this patent is extended or adjusted under 35 U.S.C. 154(b) by 96 days.

(21) Appl. No.: 14/265,002

(22) Filed: Apr. 29, 2014

(51) Int. Cl.
*H05K 7/20* (2006.01)

(52) U.S. Cl.
CPC ............................. *H05K 7/20709* (2013.01)

(58) Field of Classification Search
CPC .... H05K 7/183; H05K 7/186; H05K 7/20618; H05K 7/20145; H05K 7/20736; H05K 7/20754; H05K 13/0486
USPC .................................................... 361/679.46
See application file for complete search history.

(56) References Cited

U.S. PATENT DOCUMENTS

| 4,790,762 | A  | * | 12/1988 | Harms   | H05K 7/1478 |
|           |    |   |         |         | 439/59      |
| 6,542,363 | B2 | * | 4/2003  | White   | F24F 13/1486 |
|           |    |   |         |         | 361/695     |
| 6,643,132 | B2 | * | 11/2003 | Faneuf  | H05K 7/20809 |
|           |    |   |         |         | 165/104.33  |
| 8,305,756 | B2 | * | 11/2012 | Regimbal | H05K 7/2019 |
|           |    |   |         |         | 361/695     |
| 2003/0112582 | A1 | * | 6/2003 | Sanders | H05K 7/1492 |
|           |    |   |         |         | 361/600     |
| 2005/0050272 | A1 | * | 3/2005 | Behrens | G06F 1/18 |
|           |    |   |         |         | 711/114     |
| 2012/0120586 | A1 | * | 5/2012 | Katata  | G06F 13/409 |
|           |    |   |         |         | 361/679.32  |
| 2014/0177164 | A1 | * | 6/2014 | Stewart | H05K 7/20145 |
|           |    |   |         |         | 361/679.46  |

OTHER PUBLICATIONS

U.S. Appl. No. 13/693,970, filed Dec. 4, 2012, Michael David Marr.
Open Compute Project, "Open Rack Hardware V1.0", Pierluigi Sarti, et al., Sep. 18, 2012, pp. 1-16.

(Continued)

*Primary Examiner* — Tuan T Dinh
*Assistant Examiner* — Mukund G Patel
(74) *Attorney, Agent, or Firm* — Robert C. Kowert; Meyertons, Hood, Kivlin, Kowert & Goetzel, P.C.

(57) ABSTRACT

One or more racks in a rack computing system include shelving systems with mounting portions to receive computer systems in the mounting portion. The mounting portion can include an air flap structure that can restrict airflow through internal space of the mounting portion when a rack computer system is absent from the mounting portion. The air flap structure can retract to enable a computer system to be mounted in an internal space of the mounting portion. A mounting portion can include at least a portion of a backplane assembly that can be aligned to couple with a rack computer system mounted in the mounting portion to communicatively couple the rack computer system with one or more communication networks. The mounting portion can include an ejection mechanism that can eject an installed computer system from the mounting portion.

20 Claims, 13 Drawing Sheets

(56) References Cited

OTHER PUBLICATIONS

Circuit, "Fuji Electric UL 489 Rated Molded Case Circuit Breakers (MCCBs)", downloaded Jun. 15, 2012, pp. 1-4.
U.S. Appl. No. 13/540,369, filed Jul. 2, 2012, Michael P. Czamara.
"Cisco Switch Guide—Scalable, intelligent LAN switching for campus, branch and data center networks of all sizes" Version 7, Cisco, Summer 2011, pp. 1-134.
"Cisco Nexus 7000 Series Environment" 2008-2010 Cisco, pp. 1-9.
"Cisco Nexus 7000 Solutions—New 50/60A 3-phase CDU with Locking Outlets" downloaded Jun. 29, 2011 from http://www.servertech.com/solutions/data-center-power/cisco-nexus-7000/ , pp. 1-2.
"PIPS (Per Inlet Power Sensing)—Introducing the best infeed power measurement technology on the market for data center rack-level power monitoring" downloaded Jun. 29, 2011 from http://www.servertech.com/solutions/About_PIPS , pp. 1-3.
U.S. Appl. No. 13/172,173, filed Jun. 29, 2011, John W. Eichelberg.
U.S. Appl. No. 13/693,973 filed Dec. 4, 2012, Michael David Marr.
U.S. Appl. No. 78/693,978, filed Dec. 4, 2012, Michael David Marr.

* cited by examiner

RACK MOUNTING PORTION ASSEMBLY

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack computing system. Some known rack computing systems include 40 such rack-mounted components and such rack computing systems will therefore generate as much as 10 kilowatts of waste heat. Moreover, some known data centers include a plurality of such rack computing systems.

Some known data centers include methods and apparatus that facilitate waste heat removal from rack systems. Some waste heat removal systems remove waste heat from data centers by transferring waste heat to flows of air ("exhaust air"), which are then used to transport the waste heat to an environment external to the data center. Such an environment can include an ambient environment. Such methods and apparatus can include directing cooling air into an intake side of a rack in which computer systems are installed, through an interior of the rack so that the cooling air removes heat from heat-producing components of the computer systems, and is discharged from an opposite "exhaust end" of the rack as exhaust air to remove the heat from the rack.

In some cases, exhaust air can pass back from the exhaust end of the rack to the inlet end of the rack. Such "recirculation" of exhaust air may have a reduced capacity to remove heat relative to non-recirculated cooling air, and recirculated exhaust air on an inlet end of a rack may be recirculated through the rack. Such recirculation of exhaust air to the inlet end can establish a feedback loop which can lead to reduced heat removal from one or more computer systems in the rack, waste heat buildup in the rack, overheating, damage to computing components, etc. Such results can result in detrimental effects on computing capabilities of a data center.

Because a computing facility may contain a large number of servers, a large amount of connections may be required to operate the facility. For example, each server may require at least one power connection to receive operating power and at least one communication connection to be communicatively coupled with a communication network. A network of cabling, bus bars, connectors, etc., is used to couple each of the servers to respective power and communication systems. Ensuring such connections for each of the servers may require extensive expenditures of effort and resources. In addition, installing and uninstalling servers to such power and communication resources when mounted in a rack can be time consuming.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), lay cables, install racks, enclosures, and cooling systems to implement waste heat removal therefrom. Additional time and resources are typically needed to conduct inspections and obtain certifications and approvals, such as for electrical systems.

Figure 1:
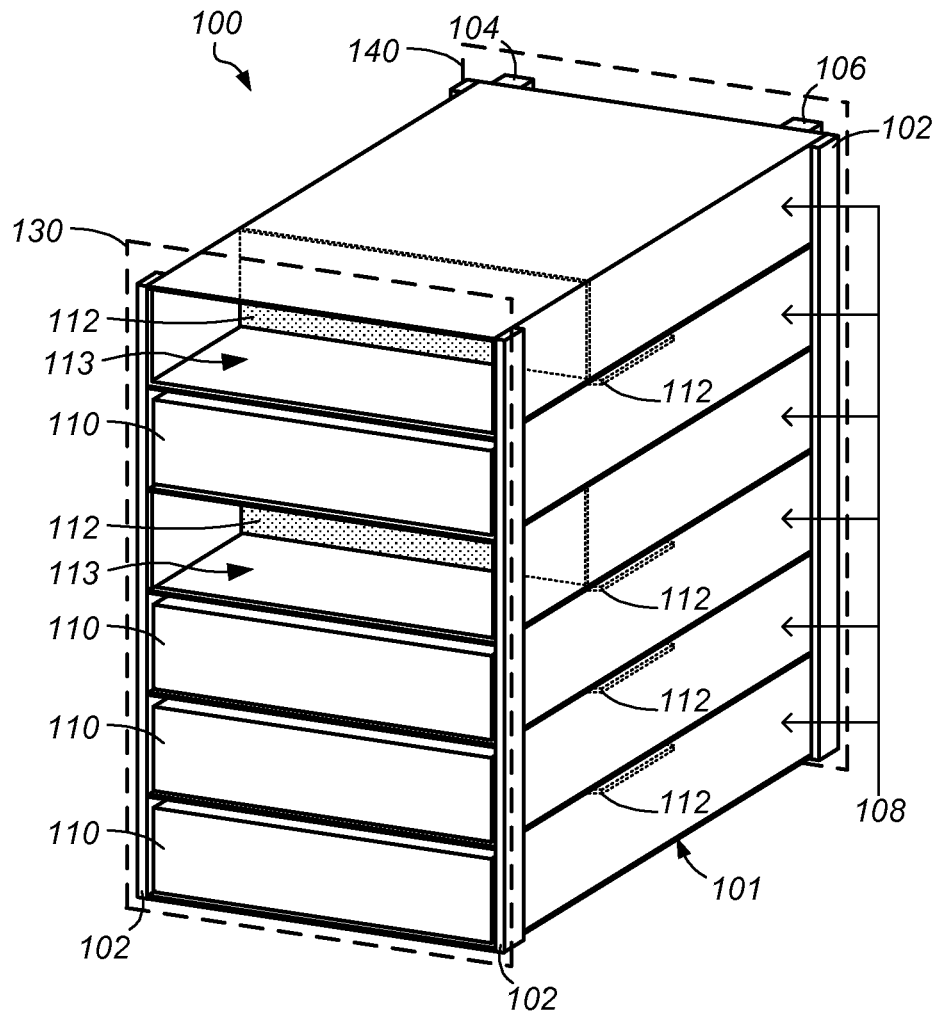
FIG. 1 is a schematic diagram illustrating a perspective view of a rack computing system in which computer systems can be mounted and including multiple shelving module mounting portions, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a modular system for a data center are disclosed. According to one embodiment, a data center includes a rack, a backplane assembly, and air flap structures. The rack includes mounting portions that can each receive and structurally support at least one of a plurality of rack computing systems mounted in the respective one of the plurality of mounting portions. The backplane assembly is communicatively coupled to a communication network and extends along a portion of a rear end of the rack. The backplane assembly can communicatively couple each of the plurality of rack computing systems mounted in separate ones of the plurality of mounting portions with the communication network based at least in part upon each of the plurality of rack computing systems being mounted in the plurality of mounting portions, such that each rack computing system mounted in a respective mounting portion couples with a respective network connector of the backplane assembly that is aligned with the respective mounting portion. The air flap structures are each coupled to a separate one of the mounting portions of the rack and can restrict airflow through the respective mounting portion based at least in part upon an absence of a rack computing system from being mounted in the respective mounting portion.

According to one embodiment, an apparatus includes a shelving module that can mount in a rack and support one or more computing systems in the rack. The shelving module includes shelving members and an air flap structure. The shelving members can form a slot for receiving a computing system to mount the computing system in the shelving module. The air flap structure is coupled to at least one of the shelving members and can to restrict airflow through the at least one slot based at least in part upon an absence of a computing system from being mounted in the at least one slot, wherein, to restrict airflow through the at least one slot, the air flap structure is configured to substantially seal a cross section of the slot substantially perpendicular to a depth of the slot through the shelving module.

According to one embodiment, a method includes providing a shelving module in a rack to configure the rack to support a computing system, and configuring the shelving module to restrict airflow through the slot between a front end of the rack and a rear end of the rack based at least in part upon an absence of a computing system from being mounted in the at least one slot. Providing the shelving module can include coupling shelving members to form a slot for receiving one of the computing systems to mount the computing system in the shelving module. Configuring the shelving module to restrict airflow through the slot based at least in part upon an absence of a computing system includes coupling an air flap structure to at least one of the two or more shelving members, wherein the air flap structure comprises a flap element configurable to substantially seal a cross section of the slot substantially perpendicular to a depth of the slot through the shelving module between the front end of the rack and the rear end of the rack.

As used herein, an "aisle" means a space next to one or more racks.

As used herein, "computing" includes any operations that can be performed by a computer, such as computation, data storage, data retrieval, or communications.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, structure, container, etc. In some embodiments, a module is prefabricated at a location off-site from a data center.

As used herein, a "rack" means a rack, container, frame, or other element or combination of elements that can contain or physically support one or more electrical systems, such as servers.

As used herein, a "rack unit" or "U" refers to a measure of standard spacing in a rack. One "rack unit", or "U", is nominally 1.75 inches. As used herein, spacing, dimensions, and pitches based on "rack units" or "U" may allow for tolerances, such as manufacturing tolerances.

As used herein, "room" means a room or a space of a structure. A "computer room" means a room in which computer systems, such as rack-mounted servers, are operated.

As used herein, "shelf" means any element or combination of elements on which an object can be rested or mounted. Such elements or combination of elements may be referred to as shelving members or combination of shelving members, respectively. A shelf may include, for example, a plate, a sheet, a tray, a disc, a block, a grid, a box or a set of support rails. A shelf may be rectangular, square, round, or another shape. In some embodiments, a shelf may include one or more rails.

As used herein, a "slot" means a space in a rack into which one or more components can be installed or removed. In some racks, slots are formed between adjacent shelving members, shelf supports or rails of the rack. A slot of a rack may have any orientation, including horizontal, vertical, or angled. A slot may be included in a shelving module mounted in a rack, where the slot is a space in the shelving module into which one or more components can be installed or removed. In some embodiments, a slot has a standard height or width, such as 1 U, 2 U, or 3 U.

As used herein, a "space" means a space, area or volume.

As used herein, "stack" includes any arrangement of elements in which one element is located at least partially above or over another element. For example, a stack of hard disk drives may include two or more hard disk drives arranged one over another. A "stack" does not require that upper elements in the stack rest on elements lower in the stack. In addition, a "stack" does not require that elements be precisely aligned vertically with respect to one another.

In various embodiments, a rack computing system includes a rack and various mounting portions in the rack, where a computer system can be mounted in the mounting portion to install the computer system in the rack. Mounting a computer can include positioning a computer in a mounting portion to be structurally supported in the mounting portion by one or more structural elements that may be included in the mounting portion. Installing a computer system can include coupling the computer system to power connections, communication connections, etc. to enable the computer system to receive operating power and communicate with one or more communication networks. One or more mounting portions may be included in a shelving module, established based at least in part upon coupled shelving members, which can include one or more slots into which a computer system can be mounted to install the computer system in the one or more mounting portions. Shelving modules may include a backplane assembly segment that is aligned with a particular portion of the shelving module, which can include a particular location on a particular end of the shelving module, so that a network connector of a computer system mounted in the slot is aligned with a network connector of the backplane assembly segment included in the shelving module, and mounting the computer system in the shelving module can include sliding the computer system into the slot to couple the network connector of the computer system with the network connector of the backplane assembly segment.

Multiple shelving modules may be coupled together, including via vertical stacking of shelving members, to establish a stack of shelving modules that may at least partially comprise a rack computing system. Coupling shelving modules together may communicatively couple backplane assembly segments of the separate shelving modules to establish a backplane assembly that is communicatively coupled to a communication network, so that computer systems coupled to at least one backplane assembly segment are communicatively coupled with the communication network via at least a portion of the backplane assembly.

Mounting portions can include portions of an interior enclosure of a shelving module included in a rack, where the mounting portion includes one or more connectors, including rails, which can structurally support a computer system mounted in the portion of internal space comprising the mounting portion. The mounting portion can include a portion of a backplane assembly that is coupled to a portion of the rack, where the portion of the backplane assembly includes at least one network connector that is aligned with the mounting portion to couple with a network connector of a computer system installed in the mounting portion.

Various embodiments of a mounting portion can include an air flap structure that can deploy into the mounting portion to restrict airflow through the mounting portion in the absence of a computer system from being mounted in the mounting portion. The air flap structure can be deployed into an internal space of the mounting portion in the absence of a countering force preventing the air flap structure from being deployed. The counting force can include a portion of the computer system that precludes air flap structure deployment, pushes a portion of the air flap structure from a deployed configured to a retracted configuration, etc.

Where a mounting portion is included in a shelving module, the shelving module can include an air flap structure that, when deployed, extends into the slot to substantially seal a cross section of the slot and restricts airflow between inlet ends and exhaust ends of the slot. An air flap structure that substantially seals a cross section of a slot of a shelving module may be referred to as partitioning at least a portion of the slot. The air flap structure can be deployed into the slot space based at least in part upon a hinge structure, gravitational force that induces a portion of the air flap structure to fall into the slot in the absence of a countering force, a pressure gradient, a spring mechanism that forces a portion of the air flap structure into the slot in the absence of a countering force that exceeds the spring force, some combination thereof, or the like. When a computer system is installed in the shelving module slot, the computer system may force a portion of the air flap structure away from the slot space to unseal the slot, retract the air flap structure into a retracted configuration, and enable the computer system to be mounted through the cross section to install the computer system in the mounting portion.

Where a mounting portion includes a portion of an internal space of a rack that includes one or more sets of support rails, an air flap structure can be coupled to at least a portion of one or more rack members, support rails, etc. The air flap structure, when deployed, extends into the internal space of the mounting portion to substantially seal a cross section of the internal space and restricts airflow between inlet and exhaust ends of the mounting portion internal space. An air flap structure that substantially seals a cross section of an internal space of a mounting portion may be referred to as partitioning at least a portion of the internal space. The air flap structure can be deployed into the internal space based at least in part upon a hinge structure, gravitational force that induces a portion of the air flap structure to fall into the slot in the absence of a countering force, a pressure gradient, a spring mechanism that forces a portion of the air flap structure into the internal space in the absence of a countering force that exceeds the spring force, some combination thereof, or the like. When a computer system is installed in the mounting portion, including the computer system being slid on the support rails through the internal space of the mounting portion, the computer system may force a portion of the air flap structure away from the internal space to unseal the internal space, retract the air flap structure into a retracted configuration, and enable the computer system to be mounted through the cross section to install the computer system in the mounting portion.

FIG. 1 is a schematic diagram illustrating a perspective view of a rack computing system in which computer systems can be mounted and including multiple shelving module mounting portions according to some embodiments. Rack computing system 100 includes a rack 101 comprising rack members 102, bus assemblies 104 and 106, and shelving modules 108 that each comprise at least one mounting portion.

In some embodiments, a rack computing system includes one or more mounting portions configured to accommodate one or more computer systems to install the computer systems in the rack computing system. A mounting portion can be included in one or more shelving modules configured to provide structural support to the computer system in the rack computer system, various connections to communicatively couple the computer system to various services and external systems, etc. For example, in the illustrated embodiment of FIG. 1, the rack computing system 100 includes six separate shelving modules 108 that each comprise a separate mounting portion. A computer system 110 mounted in a shelving module 108 may be considered to be "installed" in the shelving module 108, rack 101, rack computer system 100, etc. where the computer system 110 is mounted in the shelving module 108 such that the computer system 110 is structurally supported by a portion of the rack computing system 100, which may include a portion of one or more mounting portions, the rack 101, etc., and the computer system 110 is coupled to one or more connectors, the connectors being aligned with one or more portions of the mounting portion, that communicatively couple the computer system 110 with one or more services, systems, etc. provided from a source external to the shelving module 108.

In some embodiments, the shelving modules 108 can be coupled to one or more of the rack members 102, adjacent shelving modules 108, some combination thereof, or the like. For example, the shelving modules 108 may be stacked vertically upon each other via coupling of connectors on one or more of top and bottom ends of the shelving modules. Stacked shelving modules 108 may transmit at least some of the structural load of the modules 108 themselves, which may include a structural load of computer systems 110 mounted in the modules 108, through the assembly of coupled shelving modules 108 to an external element. For example, the rack members 102 may provide stability to the assembly of stacked modules 108, and the structural load of the various modules 108 and computer systems 110 may be transmitted through the assembly to a floor element upon which the assembly rests.

In some embodiments, a rack computing system 100 includes one or more backplane assemblies 104, 106 to which a computer system 110 can be coupled to communicatively couple the computer system 110 to one or more with one or more external services, systems, etc.

In some embodiments, a service, system, etc. can include a power distribution system that provides operating power, and coupling a computer system to a backplane assembly may include coupling a computer system to a power backplane assembly that is communicatively coupled to the power distribution system. In the illustrated embodiment, for example, rack computing system 100 includes a power backplane assembly 104 that is coupled to an externally-located power distribution system (not shown). The power backplane assembly 104 can include one or more power connectors (not shown), and coupling a computer system 110 with a given power connector of the power backplane assembly can communicatively couple the computer system 110 to the power distribution system and enable the computer system 110 to receive operating power from the power distribution system via at least a portion of the power backplane assembly 104. In some embodiments, the power backplane assembly 104 includes multiple power connectors that are arranged on one or more sides of the power backplane assembly 104 in a pattern that aligns each of the power connectors with a portion of a separate mounting portion included in a separate shelving module 108, including a particular portion of a particular side of a separate shelving module 108. The particular portion of the mounting portion may be configured to be aligned with a power connector of a computer system 110 mounted in the mounting portion, so that aligning a computer system 110 to mount in a particular mounting portion, including a particular shelving module 108, aligns the power connector of the computer system 110 with a power connector of the power backplane assembly 104 that is aligned with a particular portion of the shelving module 108. Mounting the computer system 110 in such a mounting portion, including sliding a computer system 110 through a slot of a given shelving module 108 via an inlet end of the slot, may include mounting the computer system so that the power connector of the computer system 110 engages and couples with the power connector of the power backplane assembly 104 that is aligned with the particular portion of the shelving module 108, thereby communicatively coupling the computer system 110 to a power distribution system coupled to the power backplane assembly 104 and enabling the computer system 110 that is mounted in the shelving module 108 to receive operating power from the power distribution system via at least a portion of the power backplane assembly 104.

In some embodiments, a service, system, etc. can include a communication network, and coupling a computer system to a backplane assembly may include coupling a computer system to a communication backplane assembly that is communicatively coupled to the communication network. In the illustrated embodiment, for example, rack computing system 100 includes a communication backplane assembly 106 that is coupled to an external communication network (not shown). The communication backplane assembly 106 can include one or more network connectors (not shown), and coupling a computer system a given network connector of the communication backplane assembly can communicatively couple the computer system to the communication network and enable communication between the computer system and the communication network via at least a portion of the power backplane assembly. In some embodiments, the communication backplane assembly 106 includes multiple network connectors that are arranged on one or more sides of the communication backplane assembly in a pattern that aligns each of the network connectors with a portion of a separate mounting portion, including a particular portion of a particular side of a shelving module 108. The particular portion of the mounting portion may be configured to be aligned with a network connector of a computer system 110 mounted in the mounting portion, so that aligning a computer system 110 to mount in a particular mounting portion, including a shelving module 108, aligns the network connector of the computer system 110 with a network connector of the communication backplane assembly 106 that is aligned with a particular portion of the shelving module 108. Mounting the computer system 110 in such a mounting portion, including sliding a computer system 110 through a slot of a given shelving module 108 via an inlet end of the slot, may include mounting the computer system so that the network connector of the computer system 110 engages and couples with the network connector of the communication backplane assembly 106 that is aligned with the particular portion of the shelving module 108, thereby communicatively coupling the computer system 110 to a communication network to which the communication backplane assembly 106 is communicatively coupled and enabling communication between the computer system 110 that is mounted in the shelving module 108 and the communication network via at least a portion of the communication backplane assembly 106.

In some embodiments, a rack computing system 100 includes one or more network switch devices, which can be mounted in a mounting portion that may include a shelving module, that are communicatively coupled to the communication network, and one or more network connectors of the communication backplane assembly may couple with the network switch device to communicatively couple the computer systems coupled to network connectors of the communication backplane assembly with the communication network via the network switch device.

In some embodiments, a rack computer system 100 includes inlet ends and exhaust ends, where cooling air can be received into various internal spaces of various mounting portions via the inlet end to remove heat from one or more heat producing components of one or more computer systems installed in the mounting portions to generate exhaust air. The inlet end may be in flow communication with a cooling air system that provides cooling air to a portion of a computing room, data center, etc., in which the rack computer system 100 is located. For example, where the rack computing system 100 is mounted in a computing room, the rack computing system 100 may be mounted adjacent to a "cold aisle" space into which cooling air is supplied from one or more cooling air systems, including a duct system, raised floor plenum, etc., where an inlet end 130 of the rack computing system 100 faces the cold aisle and cooling air can be received into one or more internal spaces of shelving modules 108, including being received into one or more computer systems 110 mounted in the shelving modules 108, to remove heat from one or more heat producing components of the one or more computer systems 110.

In some embodiments, exhaust air can be discharged from the internal spaces of the mounting portions via an exhaust end of the rack computer system, where the exhaust end may be in flow communication with an exhaust air removal system that can remove exhaust air from a computing room, data center, etc. For example, where the rack computing system 100 is mounted in a computing room, the rack computing system 100 may be mounted adjacent to a "hot aisle" space into which exhaust air is discharged and from which the exhaust air can be removed via one or more various air removal systems in flow communication with the hot aisle, where an exhaust end 140 of the rack computing system 100 faces the hot aisle and exhaust air can be discharged into the hot aisle from one or more internal spaces of shelving modules 108, including from exhaust ends of one or more computer systems 110 mounted in the shelving modules 108, to remove heat from the rack computing system 100. Various mounting portions in a rack computing system, including shelving modules 108, may be configured to receive computer systems 110, into a slot of the shelving module 108 via an inlet end of the shelving module 108 facing the inlet end 130 of the rack computing system 100, so that an inlet end of the computer system 110 mounted in the shelving module 108 slot faces the inlet end 130 of the rack computing system 100 an received cooling air via the inlet end. In some embodiments, including the illustrated embodiment, backplane assemblies 104, 106 are coupled to rack computing system 100 on the exhaust end 140, where a computing system 110 is coupled to the backplanes when inserted into a slot of a shelving module via the inlet end 130 and is decoupled from the backplanes when removed from the slot via the inlet end 130. In some embodiments, one or more of the backplane assemblies 104, 106 can be coupled at one or more various ends of the shelving modules that are separate from the exhaust end 140, including side ends of the shelving modules, inlet ends facing the inlet end 130 of the rack computer system 100, etc. A computer system 110 may be inserted into a slot of a shelving module 108 via the exhaust end 140 to mount the computer system 110 in the shelving module 108, in some embodiments.

In some embodiments, various mounting portions in a rack computing system, including various mounting portions included in one or more shelving modules, include one or more air flap structures that can deploy into an interior of the mounting portion to restrict airflow through the interior portion. An air flap structure can be coupled to one or more portions of a rack computing system, including one or more portions of the mounting module. In the illustrated embodiment, each shelving module 108 includes an air flap structure 112 which is configured to deploy into an internal space 113 of the respective shelving module, including a slot space, to substantially restrict airflow through the internal space of the shelving module 108 between the inlet end of the shelving module 108 facing the inlet end 130 of the rack computing system 100 and the exhaust end of the shelving module 108 facing the exhaust end 140 of the rack computing system. As shown, the air flap structure 112 can be configured to deploy into a deployed configuration to extend across at least a portion of a cross section of the internal space, where the cross section extends at least partially perpendicular to a depth between the inlet end and the exhaust end. In some embodiments, the plane may extend at an angle to the inlet end and the exhaust end. The air flap structure 112 can extend into the deployed configuration based at least in part upon an absence of one or more devices, including a computer system 110, from the internal space 113 of the shelving module, and may retract into a retracted configuration based at least in part upon a device being mounted in the internal space 113. For example, as shown, a computer system 110 being inserted into the internal space 113 of a shelving module 108 may push a portion of the air flap structure into a retracted configuration, so that the computer system 110 being mounted in the shelving module can be inserted through the cross section. In some embodiments, the air flap structure deploys into the internal space 113 from an upper portion of the internal space, as shown. In some embodiments, the air flap structure 112 deploys into the internal space from a lower portion of the internal space.

An air flap structure 112 deployed in a deployed configuration, illustrated in two of the shelving modules 108 in FIG. 1, may restrict airflow between the inlet end 130 and exhaust end 140 through the internal space 113 in which the air flap structures 112 are deployed. For example, an air space, which may include a "hot aisle" space, to which the exhaust end 140 faces may be at a higher air pressure than the air space, which may include a "cold aisle" space, to which the inlet end 130 faces. When a computer system 110 is mounted in an internal space 113, the computer system 110 may preclude air flow from the exhaust end 140 to the inlet end 130 via operation of one or more air moving devices to induce airflow from the inlet end 130 to the exhaust end 140 via an interior of the computer system 110. In the absence of a computer system 110 being mounted in an internal space 113, a pressure gradient may exist from the exhaust end 140 towards the inlet end 130, and exhaust air may flow through the internal space 110 in which a computer system 110 is absent to the space facing the inlet end 130. As such exhaust air may have an elevated temperature, based at least in part from having removed heat from one or more heat producing components mounted in the rack computer system 100, other computer systems, etc., the "recirculated" exhaust air may have a reduced capability to remove heat from heat producing components relative to the cooling air. Where such recirculated exhaust air is directed back through one or more computer systems 110, the recirculated exhaust air may lead to reduced heat removal from the computer system 110, which can cause an increase of interior temperature of a computer system, reduced operating performance, overheat of various components, thermal damage, etc.

In some embodiments, where an air flap structure 112 is deployed into a deployed configuration in an internal space in the absence of a computer system 110 from being mounted in the shelving module, the air flap structure may preclude exhaust air from being recirculated from the exhaust end 140 to the inlet end 130. To restrict airflow, the air flap structure 112 may substantially seal a cross section of the internal space 113. The air flap structure 112, in a deployed configuration, may partition the internal space 113 to restrict airflow between the partitioned portions of the internal space 113. In some embodiments, where an air flap structure 112 is deployed into a deployed configuration in an internal space in the absence of a computer system 110 from being mounted in the shelving module, the air flap structure 112 may preclude cooling air from flowing from the inlet end 130 to the exhaust end 140, thereby preventing bypass of computer systems 110 installed in the rack computing system 100 and thereby at least partially mitigating a waste of cooling capacity.

Substantially sealing a cross section of a space can include partitioning the space, at the cross section, into two portions, such that airflow between the two portions through the cross section is inhibited. Substantially sealing a cross section can include partitioning the space at the cross section within manufacturing tolerances of construction of the air flap structure, such that at least some air leakage across the cross section occurs. For example, an air flap structure 112 that is constructed, within manufacturing tolerances, to extend across a cross section of an internal space 113, so that the air flap structure 112 can partition the internal space 113 to inhibit an airflow 113, may not completely seal the cross section from at least some air leakage across the cross section due to gaps between the air flap structure 112 and the portions of the shelving module 108 bounding the space 113. Leakage may occur due to limitations of manufacturing tolerances regarding one or more of the shelving module 108 and the air flap structure 112. Despite such leakage, such an air flap structure 112 will be understood to have sufficiently sealed the cross section of the internal space 113. In some embodiments, an air flap structure that completely seals the cross section, such that any flow of air across the cross section in the internal space 113, including leakage, is inhibited will be understood to have substantially sealed the cross section. The air flap structure 112 can comprise a flap element that is impermeable to air flow, such that airflow through the flap element itself is inhibited.

Figure 2:
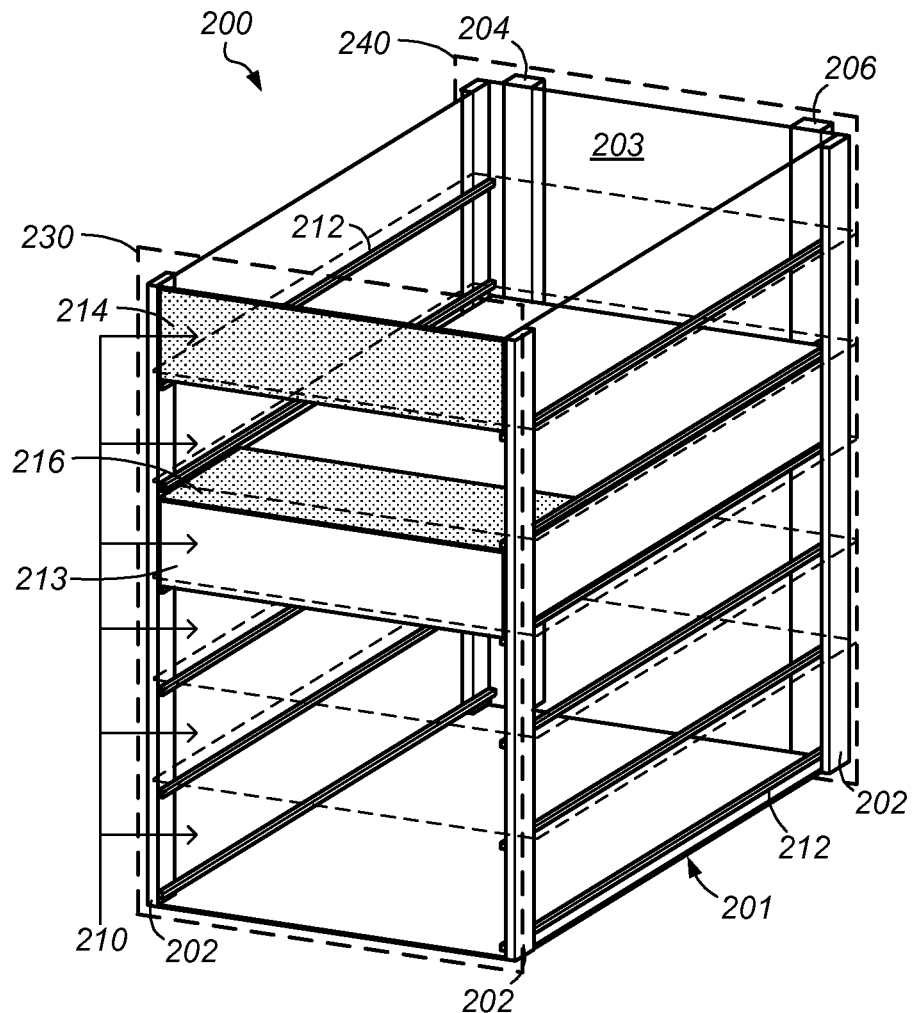
FIG. 2 is a schematic diagram illustrating a perspective view of a rack computing system in which computer systems can be mounted and including an enclosure with mounting portions, according to some embodiments.

FIG. 2 is a schematic diagram illustrating a perspective view of a rack computing system in which computer systems can be mounted and including an enclosure with mounting portions according to some embodiments. Rack computing system 200 includes a shelving module 201 comprising rack members 202, bus assemblies 104 and 106, and a shelving module that comprises multiple mounting portions 210.

In some embodiments, a shelving module 201 includes multiple mounting portions 210. The shelving module can comprise at least a portion of an internal space, also referred to as an "enclosure", of a rack, where the portion of the internal space includes multiple sub-portions of the internal space that each include components configured to provide structural support to a computer system in the rack computer system, various connections to communicatively couple the computer system to various services and external systems, etc. Such sub-portions may be referred to as mounting portions in the shelving module. For example, in the illustrated embodiment of FIG. 2, the rack computing system 200 includes a shelving module 201 that includes six separate mounting portions 210 that each comprise a separate portion of internal space 203 of the shelving module 201. A computer system 213 can be mounted in a mounting portion 210 to install the computer system 213 in the rack computing system 200. The computer system 213 may be considered to be "installed" in the mounting portion 210, shelving module 201, rack computer system 200, etc. where the computer system 213 is mounted in the mounting portion such that the computer system 213 is structurally supported by a portion of the rack computer system 200, which may include a portion of one or more sets of support rails 212, etc., and the computer system 213 is coupled to one or more connectors, the connectors being aligned with one or more portions of the mounting portion 210, that communicatively couple the computer system 213 with one or more services, systems, etc. provided from a source external to the shelving module 201.

In some embodiments, the shelving module 201 includes one or more sets of structural support members that provide structural support to a computer system mounted in one or more mounting portions 210. For example, in the illustrated embodiment, shelving module 201 includes multiple sets of support rails, where each set of support rails comprises a pair of support rails coupled to rack members 202 and extending along opposite side ends of a given mounting portion 210, and where the set of support rails can structurally support a computer system 213 mounted in a mounting portion 210 internal space 203. In some embodiments, a set of support rails 212 can provide alignment and guiding of a computer system inserted into a mounting portion 210 internal space 203 to enable the computer system 213 to be aligned in the mounting portion. Aligning the computer system 213 can include aligning the computer system 213 with respect to one or more connectors that are themselves aligned with particular portions of the mounting portion 210, so that a given connector of the computer system 213 is aligned with a given corresponding connector aligned with a particular portion of the mounting portion 210. The support rails 212 may be configured to enable a computer system 213 inserted into an internal space 203 of a mounting portion 210 to slide through the internal space to be mounted in the mounting portion, including sliding through the internal space 203 to couple with one or more connectors to "install" the computer system 213 in the mounting portion 210, shelving module 201, rack computing system 200, etc.

In some embodiments, a rack computing system 200 includes one or more backplane assemblies 204, 206 to which a computer system can be coupled to communicatively couple the computer system 213 to one or more with one or more services, systems, etc. For example, in the illustrated embodiment, rack computing system 200 includes a power backplane assembly 204 and a communication backplane assembly 206 coupled to the shelving module 201. Each backplane assembly 204, 206 may include one or more connectors arranged on the backplane assembly to align a given connector of the given backplane assembly with a particular portion of a particular mounting portion 210. The particular portion of the mounting portion 210 may be configured to be aligned with a given connector of a computer system 213 mounted in the mounting portion 210, so that aligning a computer system 213 to mount in a particular mounting portion 210 aligns the connector of the computer system 213 with the given connector of the backplane assembly that is aligned with the particular portion of the mounting portion 210. Mounting the computer system 213 in such a mounting portion 210, including sliding a computer system 213 through the internal space 203 of a given mounting portion 210 via an inlet end 230, may include inserting the computer system 213 in the mounting portion internal space 203 so that a given connector of the computer system 213 engages and couples with a particular corresponding connector of a particular backplane assembly 204, 206 that is aligned with a particular portion of the mounting portion, thereby communicatively coupling the computer system 213 to a particular service, system, etc. A service, system, etc. can include a power distribution system, a communication network, etc.

In some embodiments, a rack computer system 200 includes an inlet end 230 and an exhaust end 240, where cooling air can be received into various internal spaces 203 of various mounting portions 210, via the inlet end 230, to remove heat from one or more heat producing components of one or more computer systems 213 installed in the mounting portions 210 to generate exhaust air. In some embodiments, exhaust air can be discharged from the internal spaces 203 of the mounting portions 210 via an exhaust end 240 of the rack computing system 200, where the exhaust end may be in flow communication with an exhaust air removal system that can remove exhaust air from a computing room, data center, etc. Various mounting portions 210 in a rack computing system may be configured to receive computer systems 213, into an internal space 203 of the mounting portion 210, via an inlet end of the mounting portion 210 facing the inlet end 230 of the rack computing system 200, so that an inlet end of the computer system 213 mounted in the mounting portion 210 internal space 203 faces the inlet end 230 of the rack computing system 200 and receives cooling air via the inlet end 230. In some embodiments, including the illustrated embodiment, backplane assemblies 204, 206 are coupled to rack computing system 200 on the exhaust end 240, where a computer system 213 is coupled to the backplanes when inserted into the internal space 203 of a mounting portion 210 via the inlet end 230 and is decoupled from the backplane assemblies when removed from the internal space 203 via the inlet end 230. In some embodiments, one or more of the backplane assemblies 204, 206 can be coupled at one or more various ends of the mounting portions 210, inlet ends facing the inlet end 230 of the rack computer system 200, etc. A computer system 213 may be inserted into an internal space 203 of a mounting portion 210 via the exhaust end 240 to mount the computer system 213 in a mounting portion 210, in some embodiments.

In some embodiments, a shelving module 201 in a rack computing system 200 includes one or more air flap structures 214, 216 that can deploy into one or more internal spaces 203 of one or more mounting portions 210 to restrict airflow through at least a portion of the shelving module 201. An air flap structure can be coupled to one or more portions of a rack computing system 200, including one or more support rails 212, rack members 202, etc. In the illustrated embodiment, shelving module 201 includes multiple air flap structures 214, 216 which are each coupled to a pair of rack members 202 and is configured to deploy into an internal space 203 of a separate mounting portion 210 to substantially restrict airflow through at least the internal space 203 of the mounting portion between the inlet end of the mounting portion 210 facing the inlet end 230 of the rack computing system 200 and the exhaust end of the mounting portion 210 facing the exhaust end 240 of the rack computing system 200. As shown, the air flap structure 214 can deploy into a deployed configuration to extend across at least a portion of a cross section of an internal space 203, where the cross section extends at least partially perpendicular to a depth between the inlet end and the exhaust end through at least the mounting portion 210. In some embodiments, the plane may extend at an angle to the inlet end and the exhaust end. The air flap structure can extend into the deployed configuration based at least in part upon an absence of one or more devices, including a computer system, from the internal space of a given mounting portion, and may retract into a retracted configuration based at least in part upon a device being mounted in the internal space. For example, as shown, a computer system 213 being inserted into the internal space 203 of a mounting portion 210 may push a portion of an air flap structure 216 into a retracted configuration, so that the computer system 213 being mounted in the mounting portion can be inserted through the cross section. In some embodiments, the air flap structure deploys into the internal space 203 from an upper portion of the internal space, as shown. In some embodiments, the air flap structure deploys into the internal space 203 from a lower portion of the internal space. An air flap structure 214 deployed in a deployed configuration may restrict airflow between the inlet end 230 and exhaust end 240 through one or more internal spaces 203 of the shelving module 201 in which the air flap structure 214 is deployed. For example, an air space structure 214 may substantially seal a cross section of the internal space 203 and may partition the internal space 203.

Figure 3A:
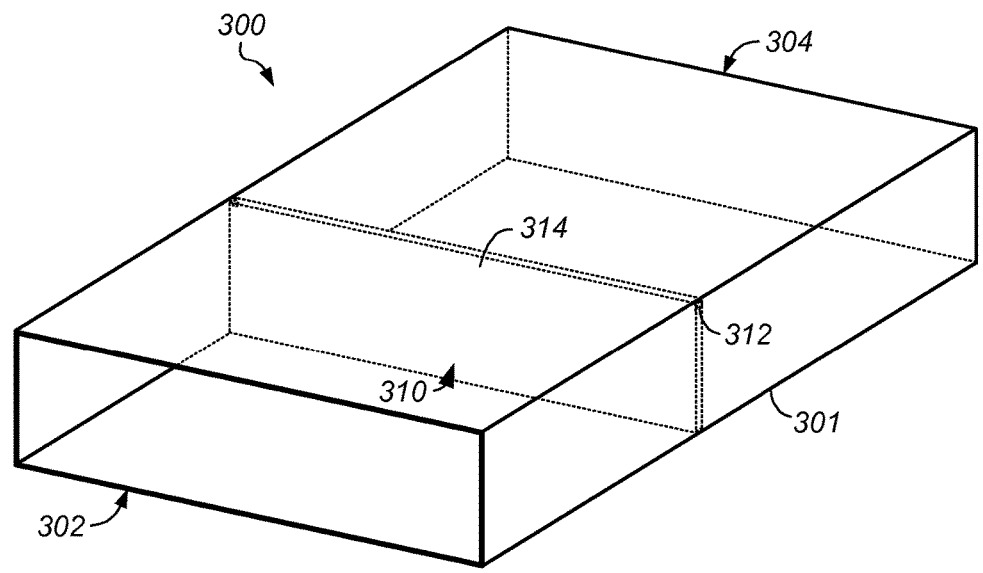
FIG. 3A-B illustrate a perspective view of a shelving module mounting portion, according to some embodiments.
Figure 3B:
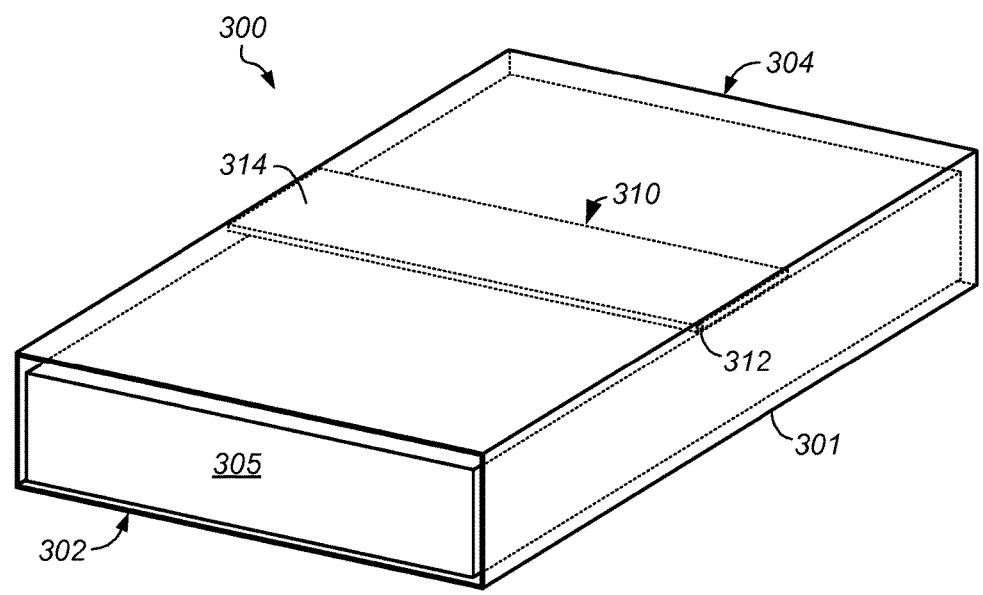

FIG. 3A-B illustrate a perspective view of a shelving module mounting portion according to some embodiments. Shelving module 300 includes a housing 301 encompassing a slot space, an inlet end 302 of the slot space, an exhaust end 304 of the slot space, and an air flap structure 310.

In some embodiments, a shelving module includes a single mounting portion into which a computer system can be installed. In the illustrated embodiment of FIG. 3A-B, a shelving module 300 includes a housing 301, which can include a structure comprised of one or more structural members, which encompasses a slot space. The illustrated housing encompasses top, bottom, and side ends of the slot space, and inlet end 302 and exhaust end 304 are substantially unencompassed by the housing 301. The members comprising the housing 301 can include a single member that is formed into the housing, including a plastic frame, bent metal element, etc. In some embodiments, the housing is established via coupling of two or more members; for example, the top and bottom ends of the housing 301 can be encompassed by separate pieces of material, and additional separate members, including separate members establishing the side ends of the housing 301, may be coupled to the top and bottom members of the housing 301 to establish the housing 301.

As shown in FIG. 3A-B, the slot space at least partially encompassed by the housing 301 can include an internal space of the shelving module 300 into which a computer system 305 can be inserted to mount the computer system 305 in the shelving module 300. In some embodiments, a computer system 305 can be inserted through one or both of the inlet end 302 or exhaust end 304 into the slot space to mount the computer system in the shelving module 300. The computer system 305 can be inserted through the slot space via sliding the computer system 305 along one or more surfaces of one or more structural elements comprising the housing 301.

Shelving module 300 includes an air flap structure 310 that can be deployed into a deployed configuration in the absence of a computer system 305 being mounted in the shelving module 300 and can be retracted into a retracted configuration where a computer system 305 is mounted in the shelving module 300. Air flap structure 310 includes a hinge element 312, which can include a rod structure coupled to the housing 301, and a flap element 314.

As shown in FIG. 3A, an air flap structure 310 in a deployed configuration includes the flap element 314 extending into the slot space of the shelving module 300. The flap element extends through a cross section of the slot space, partitioning the slot space and restricting airflow between the partitioned portions. This partitioning by the flap element 314 in the deployed configuration can include substantially sealing the cross section of the slot space, which can restrict air from flowing between the separate inlet end 302 and exhaust end 304 via the slot space. In some embodiments, where air at the inlet end 302 is at a higher pressure than air at the exhaust end, the deployed flap element 314 can restrict airflow from the inlet end to the exhaust end 304, which can mitigate a bypass of air through a rack computing system. In some embodiments, where air at the exhaust end 304 is at a higher pressure than air at the inlet end 302, the deployed flap element 314 can restrict airflow from the exhaust end to the inlet end, which can mitigate a recirculation of exhaust air through a rack computing system.

The air flap structure 310 can be deployed into the slot space based at least in part upon a hinge structure, gravitational force that induces a portion of the air flap structure to fall into the slot in the absence of a countering force, a pressure gradient, a spring mechanism that forces a portion of the air flap structure into the slot in the absence of a countering force that exceeds the spring force, some combination thereof, or the like. For example, in FIG. 3A, in the absence of a counting force pushing the flap element out of the slot space, the flap element 314 may fall into the deployed configuration based at least in part upon gravity. The flap element 314 may rotate into the deployed configuration based at least in part upon an action of the hinge element 312, which may couple the air flap structure 310 to the housing 301. In some embodiments, the air flap structure 310 includes a spring mechanism that forces the flap element into a deployed configuration in the absence of a countering force that exceeds a spring force of the spring mechanism.

As shown in FIG. 3B, an air flap structure in a retracted configuration includes the flap element 314 retracted to extend into a portion of the slot space not occupied by a mounted computer system 305. The flap element may, in some embodiments, be refracted into a portion of the housing 301, including an indentation into one or more members comprising the housing 301.

In some embodiments, the air flap structure 310 is retracted into the retracted configuration based at least in part upon inserting a computer system 305 into the slot space of the shelving module 300 to at least partially mount the computer system 305 in the shelving module 300. For example, where a computer system 305 is inserted into the slot space of the shelving module 300 via the inlet end 302, so that the computer system 305 is slid through the slot space, the computer system 305 may encounter the deployed flap element 314 of the air flap structure 310 when the computer system 305 slides to encounter the cross section through which the deployed flap element 314 extends. The computer system, when inserted through the cross section, can push the flap element from the deployed configuration into the retracted configuration. For example, where the flap element 314 is in the deployed configuration based on gravity, the force of external housing elements of the computer system 305 provide a countering force that overcomes the force of gravity on the flap element 314 and pushes the flap element away from the cross section to the refracted configuration as the computer system continues to be inserted through the slot space. Where the flap element 314 is in the deployed configuration based at least in part upon a spring force of a spring mechanism, the force imparted by a computer system 305 being inserted through the cross section may overcome the spring force and push the flap element into the retracted configuration as the computer system continues to be inserted through the slot space. The retracted configuration of the air flap structure 310, one embodiment of which being illustrated in FIG. 3B, may include the flap element resting upon an upper surface of the computer system 305 mounted in the shelving module. In some embodiments, where the hinge element 312 is coupled to a lower portion of the housing and the flap element is projected upwards into the cross section from the lower portion in the absence of a computer system in the slot space, the air flap structure 310 in a retracted configuration may include a flap element 314 retracted beneath a mounted computer system 305, which can include a portion of the flap element 314 transmitting at least a portion of the structural load of the computer system 305 to at least a portion of the housing 301.

Figure 4A:
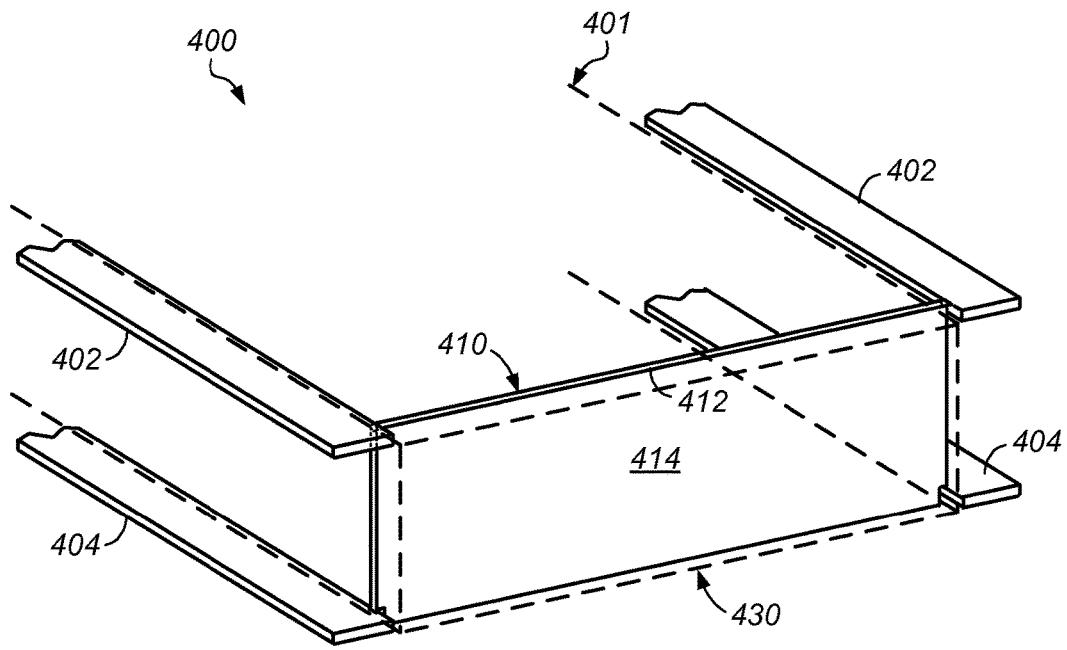
FIG. 4A-B illustrate a perspective view of a portion of a mounting portion, according to some embodiments.
Figure 4B:
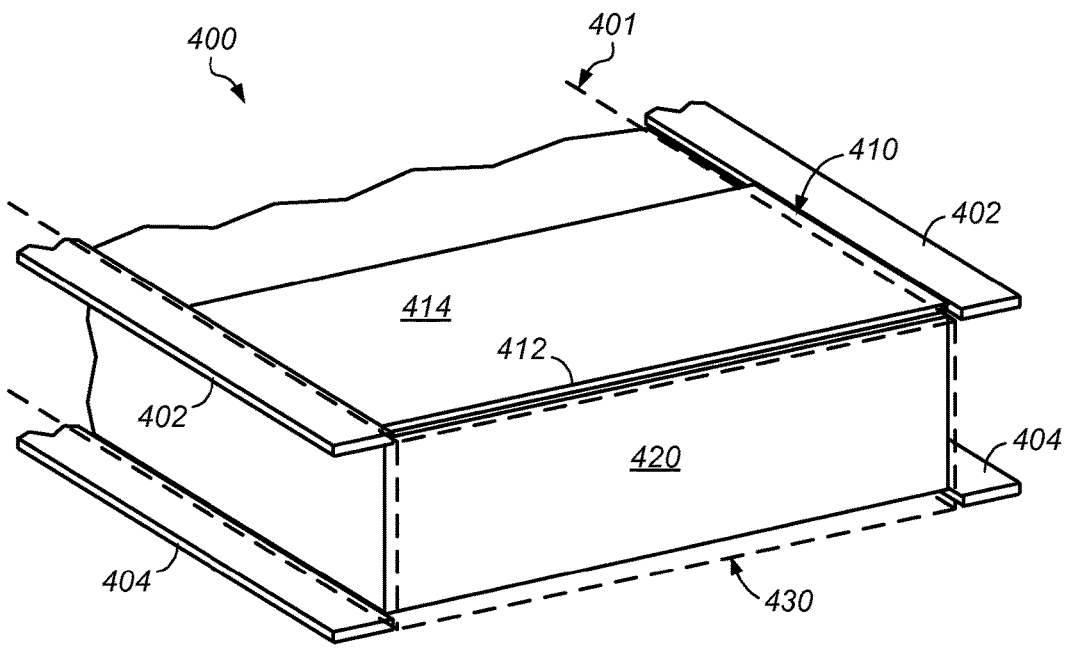

FIG. 4A-B illustrate a perspective view of a portion of a mounting portion according to some embodiments. Mounting portion 400 includes internal space 401, sets 402, 404 of support rails, and an air flap structure 410.

In some embodiments, a mounting portion includes an internal space that is at least partially established by one or more sets of structural elements of a shelving module. Structural elements may at least partially encompass the internal space, and some structural elements can be configured to structurally support one or more computer systems mounted in the internal space, another internal space, etc. For example, in the illustrated embodiment of FIG. 4A-B, mounting portion 400 includes an internal space 401 that is at least partially established and bounded by the separate sets of support rails 402, 404. In the illustrated embodiment, support rails 402 establish an upper end of the internal space 401 and support rails 404 establish a lower end of the internal space 401. In some embodiments, some structural elements establishing boundaries, ends, etc. of the internal space 401, including support rail sets 402, 404, can be at least partially located within the internal space 401.

In some embodiments, at least some structural elements associated with a mounting portion provide structural support, alignment, etc. of one or more computer systems mounted in the mounting portion. For example, as illustrated in FIG. 4B, a computer system 420 can be mounted in the internal space 401 of mounting portion 400, where the set 404 of support rails provides structural support to the computer system 420 mounted in the internal space 401. The set 404 of support rails can, in some embodiments, provide alignment to the computer system 420 in the internal space 401, including aligning the computer system 420 with the internal space 401 as the computer system 420 is inserted into the internal space 401.

In some embodiments, set 402 of support rails provides at least some alignment of computer system 420 as computer system 420 is inserted into the internal space 401. In some embodiments, set 402 of support rails can provide structural support to one or more computer systems mounted in another separate mounting portion that is adjacent above mounting portion 400. Similarly, set 404 of support rails can provide at least some alignment of one or more computer systems mounted in another separate mounting portion that is adjacent beneath mounting portion 400.

Mounting portion 400 includes an air flap structure 410 that can be deployed into a deployed configuration in internal space 401 the absence of a computer system 420 being mounted in the mounting portion 400 and can be retracted into a retracted configuration where a computer system 420 is mounted in the internal space 401 of the mounting portion 400. Air flap structure 410 includes a hinge element 412, which can include a rod structure coupled one or more sets of support rails, and a flap element 414. In the illustrated embodiment, hinge element 412 is coupled to each of the support rails 402, so that flap element 414 deploys downward into the deployed configuration. In some embodiments, hinge element 412 is coupled to one or more of the support rails 404, so that flap element 414 deploys upwards into the deployed configuration.

As shown in FIG. 4A, an air flap structure 410 in a deployed configuration includes the flap element 414 extending into the internal space 401 of the mounting portion 400. In some embodiments, the flap element 414 in a deployed configuration extends into a region of space external to the internal space 401. The flap element, in the deployed configuration, can extend through a cross section of the internal space 401, partitioning the internal space and restricting airflow between the partitioned portions. This partitioning by the flap element 414 in the deployed configuration can restrict air from flowing between the inlet end 430 and an exhaust end that is an opposite end of the internal space 401 from the inlet end 430. In some embodiments, where air at the inlet end 430 is at a higher pressure than air at the exhaust end, the deployed flap element 414 can restrict airflow from the inlet end 430 to the exhaust end, which can mitigate a bypass of air through a rack computing system. In some embodiments, where air at the exhaust end is at a higher pressure than air at the inlet end 430, the deployed flap element 414 can restrict airflow from the exhaust end to the inlet end, which can mitigate a recirculation of exhaust air through a rack computing system.

The air flap structure 410 can be deployed into the internal space 401 based at least in part upon a hinge structure, gravitational force that induces a portion of the air flap structure to fall into the slot in the absence of a countering force, a pressure gradient, a spring mechanism that forces a portion of the air flap structure into the internal space 401 in the absence of a countering force that exceeds the spring force, some combination thereof, or the like. For example, in FIG. 4A, in the absence of a countering force pushing the flap element 414 out of the internal space 401, the flap element 414 may fall into the deployed configuration based at least in part upon gravity. The flap element 414 may rotate into the deployed configuration based at least in part upon an action of the hinge element 412, which may couple the air flap structure 410 to a shelving module of a rack computing system via one or more structural elements, which can include one or more support rails 402. In some embodiments, the air flap structure 410 includes a spring mechanism that forces the flap element into a deployed configuration in the absence of a countering force that exceeds a spring force of the spring mechanism.

As shown in FIG. 4B, an air flap structure in a retracted configuration includes the flap element 414 retracted to extend into a portion of the slot space not occupied by a mounted computer system 420. The flap element 414 may, in some embodiments, be retracted into a space that lies between respective internal spaces 401 of adjacent mounting portions 400.

In some embodiments, the air flap structure 410 is retracted into the retracted configuration based at least in part upon inserting a computer system 420 into the internal space 401 of the mounting portion 400 to at least partially mount the computer system 420 in the mounting portion 400. For example, where a computer system 420 is inserted into the internal space 401 of the mounting portion 400 via the inlet end 430, so that the computer system 420 is slid through the internal space 401, the computer system 420 may encounter the deployed flap element 414 of the air flap structure 410 when the computer system 420 slides to encounter the cross section through which the deployed flap element 414 extends. The computer system, when inserted through the cross section, can push the flap element from the deployed configuration into the retracted configuration. For example, where the flap element 414 is in the deployed configuration based on gravity, the force of external housing elements of the computer system 420 provide a countering force that overcomes the force of gravity on the flap element 414 and pushes the flap element away from the cross section to the retracted configuration as the computer system continues to be inserted through the internal space 401. Where the flap element is in the deployed configuration based at least in part upon a spring force of a spring mechanism, the force imparted by a computer system 420 being inserted through the cross section may overcome the spring force and push the flap element into the retracted configuration as the computer system continues to be inserted through the internal space 401. The retracted configuration of the air flap structure 410, one embodiment of which being illustrated in FIG. 4B, may include the flap element resting upon an upper surface of the computer system 420 mounted in the mounting portion 400. In some embodiments, where the hinge element 412 is coupled to a lower portion of the mounting portion, which may include one or more support rails 404, and the flap element is projected upwards into the cross section from the lower portion in the absence of a computer system in the internal space 401, the air flap structure 410 in a retracted configuration may include a flap element 414 retracted beneath a mounted computer system 420, which can include a portion of the flap element 414 transmitting at least a portion of the structural load of the computer system 420 to at least a portion of the shelving module in which the mounting portion 400 is included.

Figure 5A:
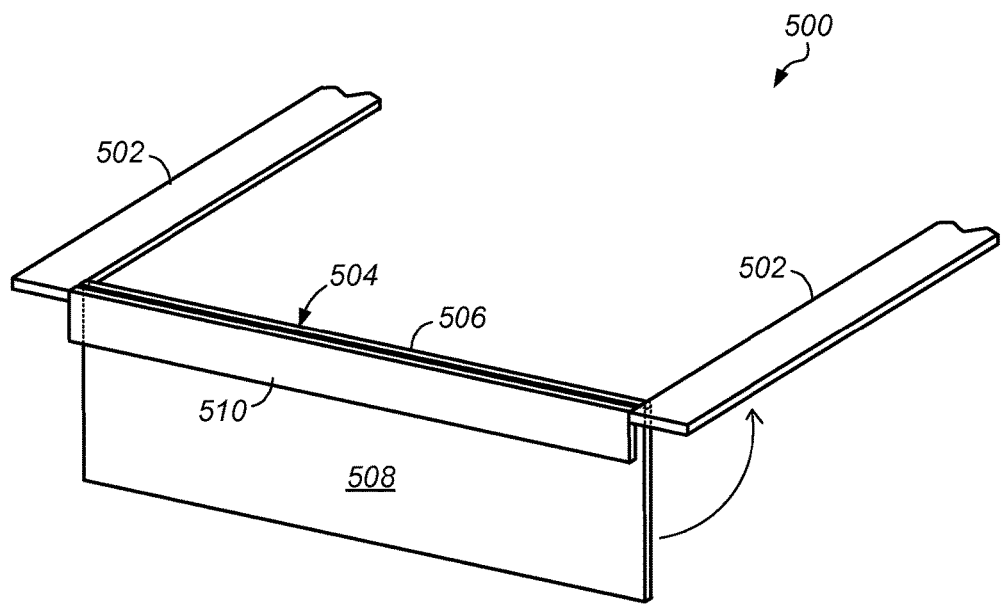
FIG. 5A-B illustrate a perspective view of a portion of a mounting portion, according to some embodiments.
Figure 5B:
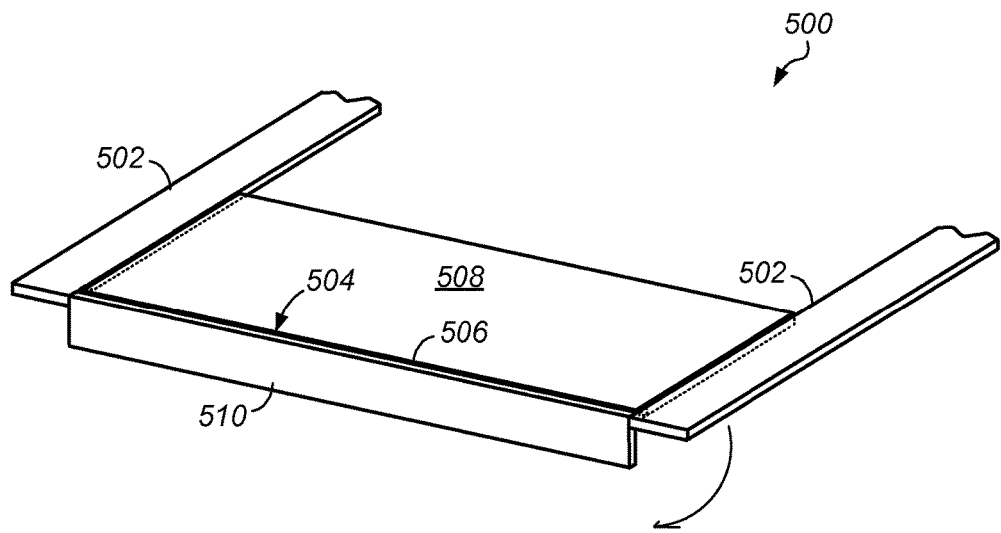

FIG. 5A-B illustrate a perspective view of a portion of a mounting portion according to some embodiments. Mounting portion 500 includes a set 502 of support rails, an air flap structure 504, and a lip structure 510.

In some embodiments, a mounting portion 500 that includes an air flap structure includes a lip structure that provides at least partial restriction of airflow through a portion a shelving module that is located between adjacent mounting portion internal spaces. The lip structure may extend adjacent to a hinge structure of an air flap structure and partition at least a portion of an internal space of a shelving module from an external environment.

In the illustrated embodiment, mounting portion 500 includes a set of support rails 502, and an air flap structure 504 that is coupled to one or more of the support rails 502. The air flap structure 504 includes a hinge element 506 and a flap element 508, where the flap element can change from a deployed configuration, shown in FIG. 5A, and a retracted configuration, shown in FIG. 5B. As shown in the illustrated embodiment, lip structure 510 extends between support rails 502 and can be coupled to one or more of the rails 502. The lip structure can restrict airflow between adjacent air flap structures 504 included in adjacent mounting portions 500.

Figure 6A:
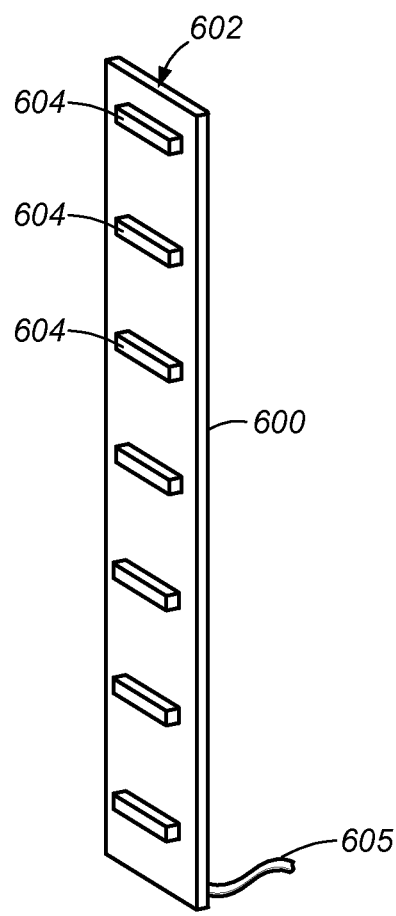
FIG. 6A-B illustrate backplane assemblies, according to some embodiments.
Figure 6B:
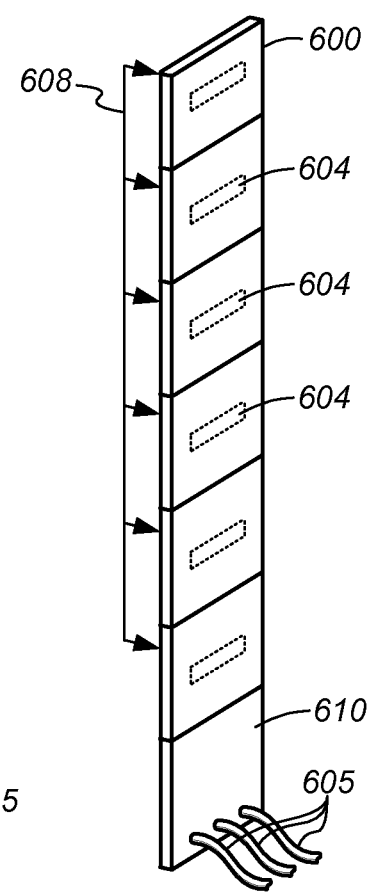

FIG. 6A-B illustrate backplane assemblies according to some embodiments.

In some embodiments, a rack computing system includes one or more backplane assemblies to which a computer system can be coupled to communicatively couple the computer system to one or more with one or more services, systems, etc. The backplane assembly can include one or more of a power backplane assembly, communication backplane assembly, etc.

In some embodiments, a backplane assembly includes connectors that can each couple to at least one computer system to communicatively couple the computer system to one or more external services, systems, etc. via at least a portion of the backplane assembly. In the illustrated embodiments of FIG. 6A-B, a backplane assembly 600 includes multiple connectors 604 that can each couple to a separate computer system mounted in one or more separate shelving modules, mounting portions, etc. in a rack computing system. As also shown in FIG. 6A-B, backplane assembly 600 is communicatively coupled to an external service, system, etc. via one or more pathways 605. Where an external service, system, etc. includes one or more power distribution systems, pathway 605 can include a power transmission line configured to supply operating power to various computer systems coupled to one or more connectors 604 via at least a portion of backplane 600. Where an external service, system, etc. includes one or more communication networks, pathway 605 can include a communication pathway, which can include one or more network communication cables, configured to communicatively couple various computer systems coupled to one or more connectors 604 to the communication network via at least a portion of backplane 600.

In some embodiments, a backplane assembly is coupled to at least a portion of a rack computing system and includes connectors 604 arranged on one or more surfaces of the backplane in a pattern that aligns one or more connectors 604 with a particular portion of one or more mounting portions. The particular portion of the mounting portion may be configured to be aligned with a connector of a computer system mounted in the mounting portion, so that aligning a computer system to mount in a particular mounting portion, including a shelving module, aligns the connector of the computer system with a connector 604 of the backplane assembly 600 that is aligned with a particular portion of the mounting portion. Mounting the computer system in such a mounting portion, including sliding a computer system through a slot of a given shelving module via an inlet end of the slot, may include mounting the computer system so that the connector of the computer system engages and couples with the connector of the backplane assembly 600 that is aligned with the particular portion of the shelving module, thereby communicatively coupling the computer system to an external service, system, etc. coupled to the backplane assembly 600.

In some embodiments, a backplane assembly includes one or more backplane segments. In the illustrated embodiment of FIG. 6A, for example, backplane assembly 600 comprises a single backplane segment 602 that comprises a single-piece circuit board. The board 602 includes multiple connectors 602, and the multiple connectors may be spaced apart in a particular arrangement that corresponds with both an arrangement of mounting portions in a rack computing system, and the relative location of a corresponding connector of a computer system mounted in each of the mounting portions. Thus, the arrangement of connectors 604 may be configured to align each connector 604 on board 602 with a corresponding connector of a computer system mounted in a corresponding mounting portion in a rack computer system, and coupling the backplane assembly 600 to a shelving module, rack member, etc. of a rack computing system can align each of the connectors 604 on board 602 with a particular portion of a respective mounting portion. In some embodiments, the backplane assembly 600 illustrated in FIG. 6A includes a network switch device that can communicatively couple each computer system coupled to a connector 604 with a communication network coupled to the backplane assembly 600 via pathway 605.

In some embodiments, a backplane assembly includes multiple backplane segments that can be coupled together to establish the backplane assembly. Such a backplane assembly may be referred to as a "combined backplane assembly", where each individual segment may be referred to as a separate backplane assembly. In the illustrated embodiment of FIG. 6B, for example, backplane assembly 600 comprises multiple backplane segments 608 that are coupled together to establish the backplane assembly 600. Each backplane segment 608 includes one or more connectors 604, and each connector on a given backplane segment may be spaced on a surface of the given backplane segment in a particular arrangement that corresponds with both the relative location of a corresponding connector of a computer system mounted in one or more mounting portions. Thus, the arrangement of a connector 604 on a given backplane segment 608 may be configured to align the connector 604 on the given segment 608 with a corresponding connector of a computer system mounted in a corresponding mounting portion in a rack computer system. Each segment can be coupled to a corresponding one or more shelving modules, mounting portions, etc. to align the connectors 604 of the given segment 608 with particular positions of the corresponding shelving modules, mounting portions, etc. Coupling segments 608 together to at least partially establish the backplane assembly 600 can include coupling separate shelving modules to which the segments 608 are separately coupled, so that the segments are aligned and couple together via complementary connectors (not shown in FIG. 6B). In some embodiments, a connector of one of the segments 608 may be configured to align into a different relative position in a corresponding mounting portion than a different connector of a different segment 608. For example, one segment may be configured to couple with a different type of computer system, where the corresponding connector of the different computer system is located at a different location on the computer system relative to other computer systems, and the segment may include a connector that is configured to align with a different position, relative to alignment positions of other segments and connectors, to couple the different computer with the backplane segment when the computer is mounted in a mounting portion. In some embodiments, the backplane assembly 600 illustrated in FIG. 6B includes a network switch device 610 that can communicatively couple each computer system coupled to a connector 604 with a communication network coupled to the backplane assembly 600 via pathway 605. The network switch device 610 can be separate from the segments 608, and the segments 608 can be coupled to the switch device 610 via coupling the coupled assembly of segments 608 to the switch device 610 via one or more connectors of one or more of the coupled segments 608, as shown in FIG. 6B.

Figure 7A:
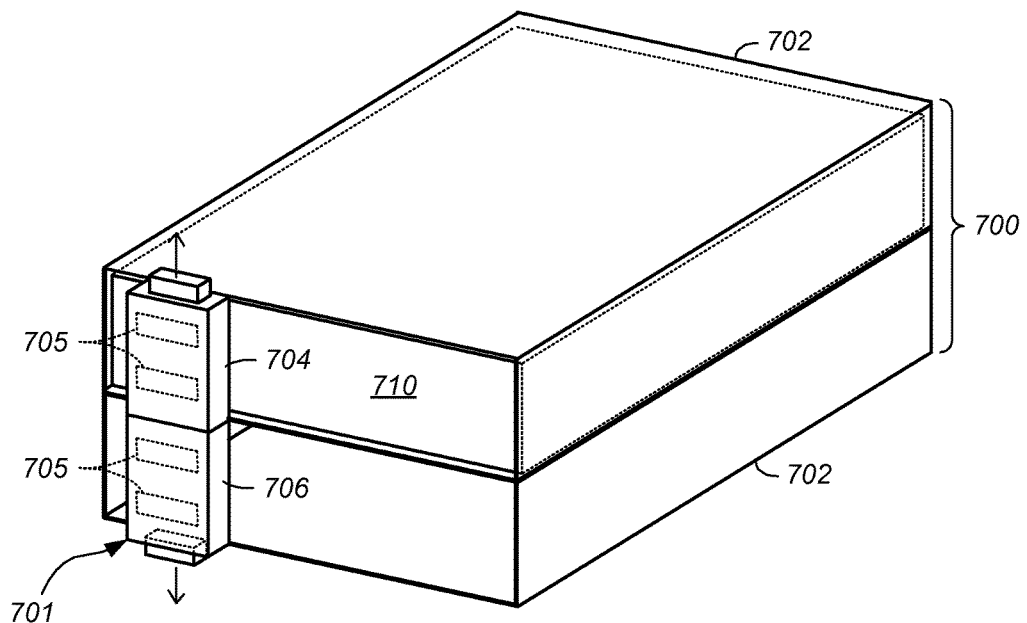
FIG. 7A-B illustrate coupling shelving module mounting portions with backplane assembly segments, according to some embodiments.
Figure 7B:
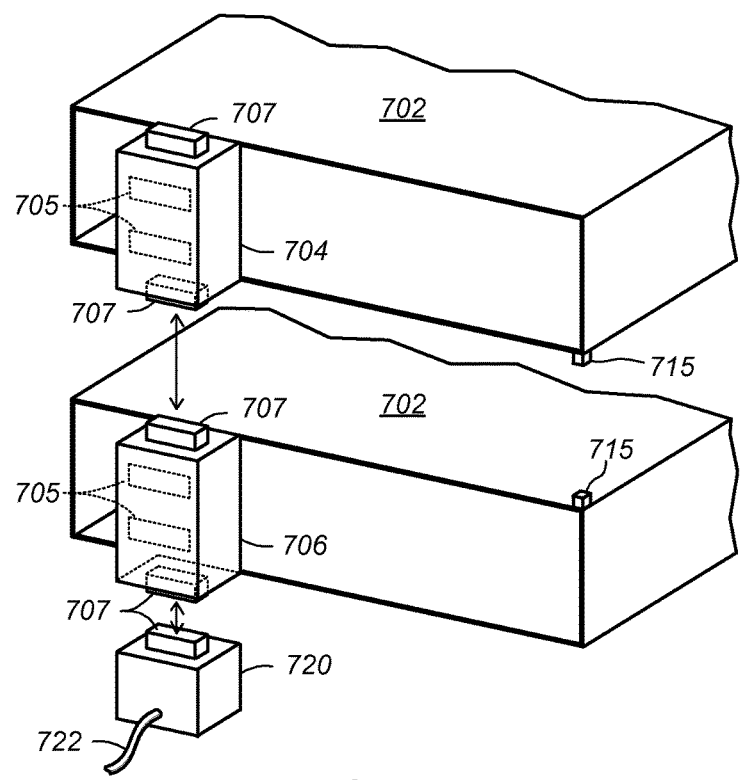

FIG. 7A-B illustrate coupling shelving module mounting portions with backplane assembly segments according to some embodiments.

In some embodiments, a backplane assembly is established based at least in part upon coupling of separate shelving modules, where each shelving module includes a separate backplane segment. As shown in the illustrated embodiment of FIG. 7A, a backplane assembly 701 can include multiple separate backplane segments 704, 706, where each backplane segment 704, 706 is coupled to a separate shelving module 702. Shelving modules 702 may be coupled to each other to establish at least a portion of a rack computing system 700. Coupling the shelving modules 702 together can, in some embodiments, include coupling the separate backplane segments 704, 706 together. In some embodiments, the backplane segments 704, 706 are coupled based at least in part upon the coupling of the separate shelving modules 702.

In some embodiments, each backplane segment 704, 706 coupled to a given shelving module 702 is coupled to a particular portion of the shelving module 702 so that a particular arrangement of connectors 705 on one or more surfaces of the backplane segment 704, 706 is aligned to couple with one or more various computer systems 710 when the computer systems 710 are mounted in the shelving module 702. As shown in FIG. 7A, backplane segment 704 can be coupled to a particular shelving module 702 in a particular configuration, where connectors 705 on a surface of the backplane segment that faces toward the slot space of the particular shelving module 702 are aligned to couple with particular corresponding connectors of computer system 710 when computer system 710 is mounted in the slot space of the particular shelving module 702.

In some embodiments, a backplane segment includes multiple connectors, where some connectors are configured to couple to separate particular connectors of separate types of computer systems, and various connectors are positioned on the segment in different alignments to be aligned with different sets of connectors of different types of computers. As a result, different types of computer systems 710 can be mounted in a given shelving module 702 and couple with a given backplane segment 704 via coupling with different sets of connectors 705 that correspond to the different types of computer systems 710.

In some embodiments, coupling a computer system 710 to one or more connectors 705 of a backplane segment 704 communicatively couples the computer system 710 to one or more external services, systems, etc. via a portion of the backplane assembly 701 that includes the backplane segment 704. For example, in the illustrated embodiment, where backplane assembly includes backplane segments 704, 706 and segment 706 is coupled to an external service, system, etc., via coupling with one or more pathways, coupling computer system 710 with one or more connectors 705 of backplane segment 704 can communicatively couple the computer system 710 with the external services, systems, etc. via at least the backplane segment 706.

In some embodiments, separate backplane segments include connectors that can couple to couple the backplane segments together to establish a backplane assembly. Such connectors can be included on one or more portions of a give backplane segment to enable the backplane segment to couple to one or more other backplane segments. In the illustrated embodiment of FIG. 7B, for example, where each separate backplane segment 704, 706 is coupled to a separate shelving module 702, the backplane segments each include complementary connectors 707 that can couple with each other to couple the backplane segments 704, 706 together. In some embodiments, shelving modules 702 can include one or more complementary connectors, coupling elements, etc. 715 which can interact between the separate shelving modules 702 to enable alignment of the shelving modules with respect to each other, coupling of the separate shelving modules together, etc.

In some embodiments, one or more of the backplane segments can be coupled with a device that is coupled with an external service, system, etc. via one or more pathways to communicatively couple the one or more backplane segments, and computer systems coupled thereto, to the external services, systems, etc. In the illustrated embodiment, for example, device 720 can be coupled to an external system, service, etc. via pathway 722. The service, system, etc. can include a power distribution system, a communication network, some combination thereof, or the like. In some embodiments, device 720 includes a network switch device. In some embodiments, device 720 includes an expander device. As shown, device 720 can include a connector 707 that can couple with a corresponding complementary connector 707 on one or more separate backplane segments 704, 706 to couple the device 720 to the one or more segments. Coupling the segments 704, 706 with the device 720 via complementary connectors 707 can communicatively couple the segments to the external services, systems, etc. to which the device 720 is coupled via pathway 722.

Figure 8A:
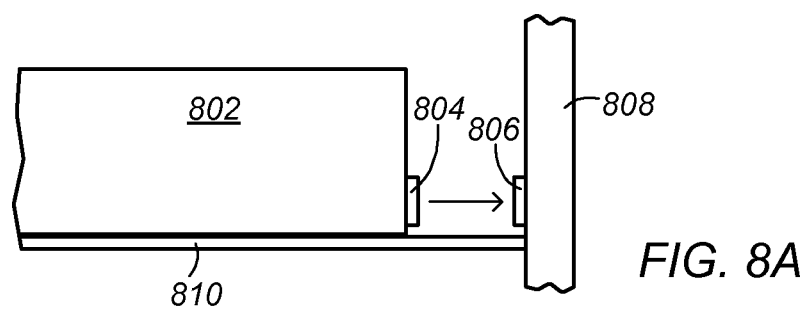
FIG. 8A-B illustrate coupling a computer system being installed in a rack mounting portion with backplane assembly, according to some embodiments.
Figure 8B:
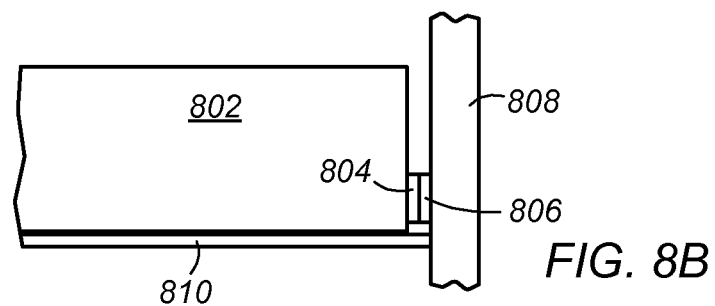

FIG. 8A-B illustrate coupling a computer system being installed in a rack mounting portion with backplane assembly according to some embodiments.

As shown in the illustrated embodiments, a computer system 802 can slide along one or more structural elements 810 included in a mounting portion to engage a connector 804 of the computer system 802 with a corresponding connector 806 of a backplane assembly 808. The structural element may include one or more of a shelving member that comprises at least a portion of a shelving module, shelving module housing, etc. The structural element may include one or more support rails. The structural element can provide at least some structural support to computer system 802 as the computer system 802 is being and continues to be mounted in a mounting portion. In some embodiments, one or more structural elements 810 may at least partially align the computer system with an internal space of a mounting portion, so that a particular connector 804 of the computer system 802 is aligned to engage with a corresponding particular connector 806 of the backplane assembly 808 as the computer system 802 is inserted into the internal space to mount the computer system 802. One or more connectors 804, 806 can include one or more pairs of complementary blind mating connectors. Engaging a pair of corresponding connectors 804, 806 can include coupling the connectors together. Inserting a computer system 802 through an internal space of a mounting portion, so that the computer system 802 is at least partially structurally supported in the internal space by one or more structural elements 810, and is coupled to one or more backplanes, via coupling of complementary connectors 804, 806, to communicatively couple the computer system 802 to one or more external services, systems, etc. via at least a portion of the backplane assembly, may be comprised within installing the computer system 802 in the mounting portion.

Figure 9:
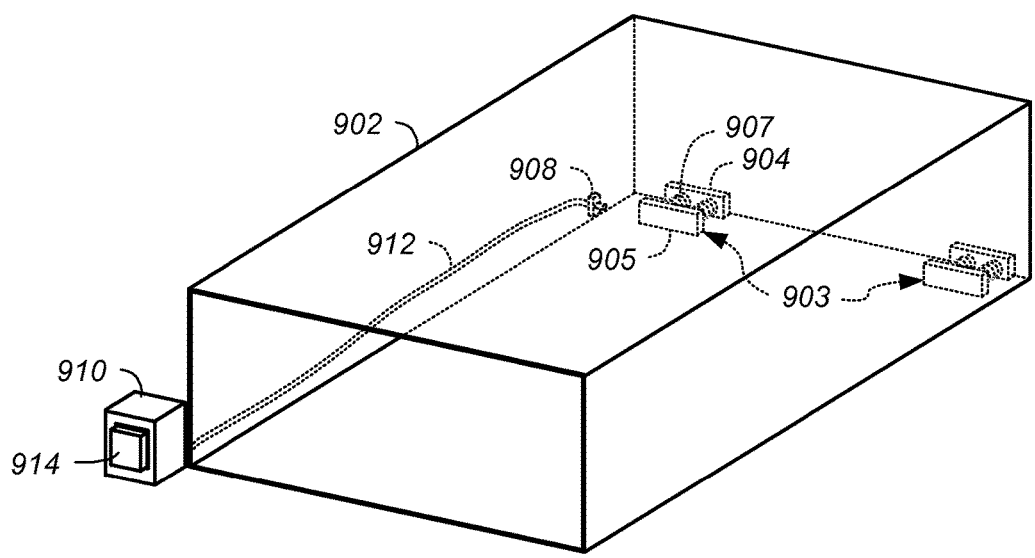
FIG. 9 illustrates a perspective view of a shelving module including a computer system ejection system, according to some embodiments.

FIG. 9 illustrates a perspective view of a shelving module including a computer system ejection system according to some embodiments.

In some embodiments, a mounting portion included in a rack computing system, which can include a mounting portion included in a shelving module, includes an ejection system that can at least partially eject a computer system from the mounting portion based at least in part upon an ejection command. The ejection system can include an element that can operate to at least partially eject the computer system via imparting a force on the computer system, and an element that can secure the computer system against ejection. In the illustrated embodiment, for example, shelving module 902 includes a pair of spring mechanisms 903 coupled to the shelving module 902. Each spring mechanism includes a backplane 904, a pusher plane 905, and one or more springs 907 coupled to each plane 904, 905, where the spring 907 can exert a spring force on the pusher plane 955 to push the plane 905 away from the backplane 904 in the absence of a greater countering force. In some embodiments, the spring mechanisms 903 can, in part or collectively, push the pusher planes 905 against one or more ends of a computer system mounted in the slot space of the shelving module 902 to push the computer system at least partially out of the slot space. For example, where the spring mechanisms 903 are each coupled to the shelving module 902 at an exhaust end of the slot space, the spring mechanisms 903 can at least partially push a computer system through an inlet end of the slot space to at least partially eject the computer system from the slot space.

In some embodiments, an ejection system includes a latch mechanism 908 that can engage with a portion of a computer system mounted in the slot space of the shelving module to secure the computer system in place in the slot space and to mitigate the spring force of the spring mechanisms 903 from at least partially ejecting the computer system. For example, the latch mechanism can include a latch element which may engage with a latch interface of a computer system to hold the computer system in place in the slot space of the shelving module 902. In some embodiments, the latch element engages as the computer system is inserted into the slot space to mount the computer system, and the latch element can be selectively disengaged from the computer system, so that the spring mechanisms 903 can push the computer system to at least partially eject the computer system.

In some embodiments, an ejection system includes an ejection interface device 910 which can transmit an ejection command to latch mechanism 908 to command the latch mechanism 908 to disengage, such that the spring mechanisms 903 at least partially eject the computer system. The ejection interface device 910 can include a user interface 914, which may comprise a button, which can receive a user-initiated interaction to cause the device 910 to generate an ejection command to the latch mechanism 908. The ejection interface device 910 can, in some embodiments, be communicatively coupled with the latch mechanism 908 via a communication pathway 912, which can include cabling, to enable the communication of signals, including an ejection command, between the device 910 and the latch mechanism 908.

FIG. 10A-E illustrates installing and ejecting a computer system 1001 in a rack mounting portion 1000 according to some embodiments. The illustrated ejection system in mounting portion 1000 includes a latch mechanism 1009, spring mechanism 1003, and ejection interface device 1012.

Figure 10A:
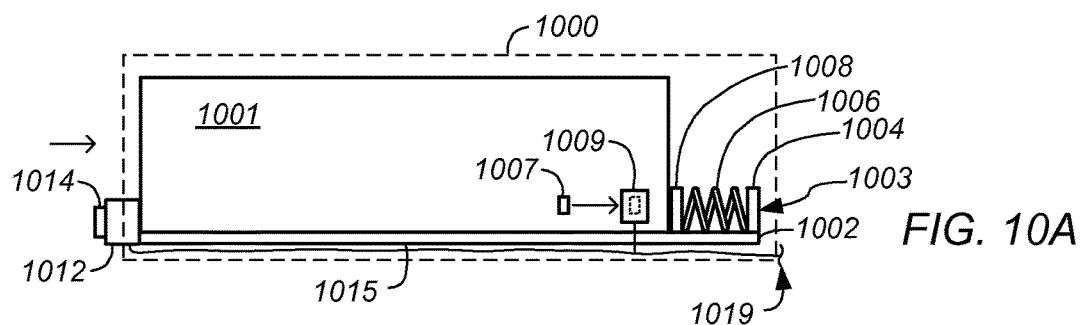
FIG. 10A-E illustrates installing and ejecting a computer system in a rack mounting portion, according to some embodiments.

As shown in FIG. 10A, a computer system 1001 can be, in some embodiments, mounted into a mounting portion 1000 to engage with an ejection system and install the computer system, according to some embodiments. As shown, the computer system 1001 can be inserted into the mounting portion 1000 via one or more ends of the mounting portion. Such insertion can include slidably mounting the computer system 1001 on one or more sets of structural elements that provide structural support to the computer system 1001 in the mounting portion. In the illustrated embodiment, for example, a mounting portion 1000 includes one or more sets of support elements 1002, which can include support rails, shelving members, etc. The illustrated computer system 1001 can be slidably mounted along one or more upper surfaces of the structural elements 1002 to mount the computer system 1001 in the mounting portion 1000.

Figure 10B:
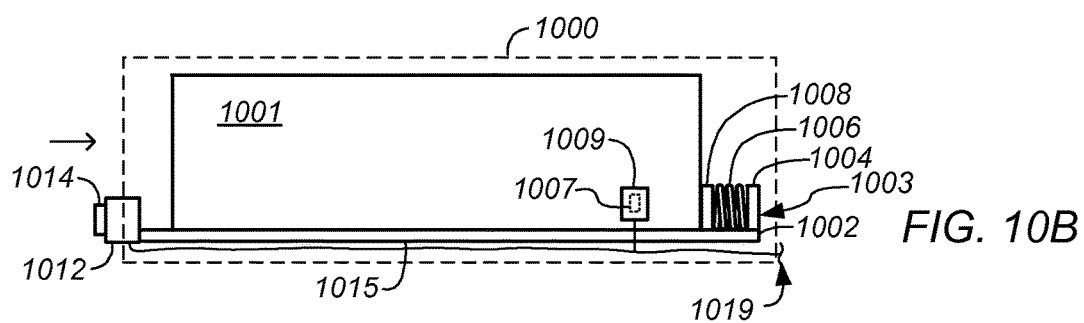

In some embodiments, a computer system 1001 includes a latch interface 1007 with which a latch mechanism 1009 can at least partially engage to secure the computer system 1001 in the mounting portion. A latch mechanism can include one or more latch elements that can engage with the latch interface. In the illustrated embodiment, for example, and as shown in at least FIG. 10D, a latch mechanism 1009 can include a latch element 1020 that can protrude from the latch element 1009 to engage with a latch interface 1007 that is at least partially aligned with the latch element 1020. As shown in at least FIG. 10A, as computer system 1001 is inserted into mounting portion 1000, a latch interface 1007 on the computer system 1001 may be in at least vertical alignment with the latch mechanism 1009 and may approach vertical and lateral alignment with the latch mechanism 1009 as the computer system 1001 is inserted into mounting portion 1000 and supported by structural element 1002. As shown in FIGS. 10B and 10D, as the computer system 1001 is inserted into mounting portion 1000, such that the latch interface 1007 of the computer system 1001 is aligned with at least latch element 1020. Where latch element 1007 is aligned with latch element 1020, as shown by at least FIG. 10D, the latch element can project into and engage with the latch interface 1007. In some embodiments, a latch interface 1007 can include a gap in one or more portions of the housing 1026 of the computer system 1001. Latch interface 1020 can, in some embodiments, project through the gap to engage with the computer system 1001. The latch element 1020, when engaged with latch interface 1007, can at least partially secure the computer system from movement in one or more directions through the mounting portion. For example, the latch mechanism 1009, when engaged with the computer system 1001 via latch element 1020 being engaged with latch interface 1007, may mitigate movement of the computer system 1001 in parallel with the directions in which the computer system 1001 is inserted and removed from the mounting portion 1000. The latch element, 1020, in some embodiments, can itself include one or more various projections, latches, etc. which can "catch" on an inner surface of the housing 1026 when the latch element 1020 has projected through the interface 1007, thereby at least partially securing the computer system 1001 against lateral movement perpendicular to the directions in which the computer system 1001 is inserted and removed from the mounting portion 1000.

In some embodiments, a latch mechanism includes a mechanism that exerts a spring force on latch element 1020 to force the element to engage with the latch interface 1007. For example, in some embodiments, a spring included in latch mechanism 1009 may exert a spring force on the latch element 1020 to push the element 1020 away from the latch mechanism. The latch element, when contacted by a portion of a housing 1026 of a computer system 1001 being inserted into the mounting portion 1000, may be forced to at least partially retract back into the latch mechanism, and the spring may push the latch mechanism 1020 to protrude outwards and through the latch interface 1007 when the interface 1007 becomes aligned with the latch element 1020, such that a countering force to the spring force on the latch element 1020 is at least partially removed. In some embodiments, retracting the latch element 1020 based at least in part upon an ejection command signal can include operation of an internal switch device in the latch mechanism, which can include a solenoid device, which pulls the latch element 1020 at least partially toward the latch mechanism 1009.

Spring mechanism 1003, as shown in the illustrated embodiments, includes a backplane 1004, spring mechanism 1006, and pusher plane 1008. The spring mechanism 1006 can include one or more mechanical springs which can exert a spring force against the backplane 1004 and pusher plane 1008. In some embodiments, the backplane 1004 is coupled in a fixed position on one or more structural elements 1002 of the mounting portion 1000, such that the spring force of the spring mechanism 1006 pushes the pusher plane 1008 through the mounting portion 1000 and away from the backplane 1004. A spring mechanism 106 can include various types of mechanical springs, including the illustrated coil springs, leaf springs, etc.

As shown in the illustrated embodiments of FIG. 10A-B, as a computer system 1001 is inserted into the mounting portion 1000, one or more portions of the computer system 1001 can come into physical contact with one or more pusher planes 1008 of one or more spring mechanisms 1003. The spring force exerted by spring mechanisms 1006, via pusher planes 1008, on the computer system 1001 can resist a force of insertion of the computer system 1001 into the mounting portion. Where the force of insertion, which may include a manual force exerted on the computer system 1001 by an operator, overcomes the spring force of the one or more spring mechanisms 1003, the computer system 1001 can continue to be inserted into the mounting portion, thereby contracting the spring mechanism 1006 and pushing the pusher plane 1006 towards the backplane 1004. As shown in FIG. 10B, where the computer system 1001 is inserted into the mounting portion 1000 such that a latch interface 1007 of the computer system 1001 is at least partially aligned with a latch mechanism 1009, the latch mechanism 1009 may engage with the computer system 1001 via latch element 1020 engaging with latch interface 1007, as discussed above, to secure the computer system 1000 in the mounting portion 1000. The latch mechanism 1009, when engaged with the computer system 1001, may exert a force on the computer system 1001 that at least matches the spring force of the one or more spring mechanisms, thereby securing the computer system 1001 in one or more particular positions in the mounting portion 1000.

Figure 10C:
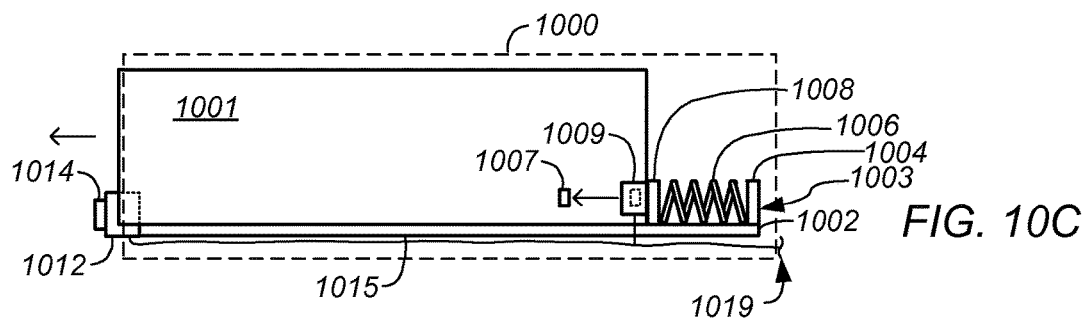
Figure 10D:
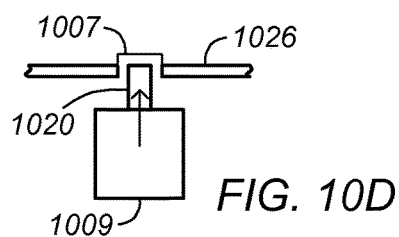

As shown in FIG. 10A-C, a mounting portion 1000 can include an ejection interface device 1012 which can transmit an ejection command to latch mechanism 1009 to command the latch 1009 to disengage from the computer system 1001, such that the spring mechanisms 1003 at least partially eject the computer system. The ejection interface device 1012 can include a user interface 1014, which may comprise a button, which can receive a user-initiated interaction to cause the device 1012 to generate an ejection command to the latch mechanism 1009. The device 1012 can, in some embodiments, be communicatively coupled with the latch 1008 via a communication pathway 1015, which can include cabling, to enable the communication of signals, including an ejection command, between the device 1012 and the latch mechanism 1009.

In some embodiments, a latch mechanism 1009 is communicatively coupled with one or more remote computer systems, via one or more communication pathways 1019. The latch mechanism 1009, in some embodiments, can receive an ejection command signal from one or more remote computer systems via pathway 1019. An ejection command signal may be generated based at least in part upon detection of one or more anomalies with regard to the computer system 1001, maintenance requirements, replacement, etc.

Figure 10E:
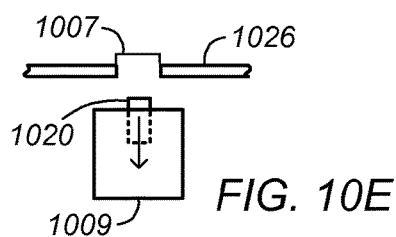

In some embodiments, a signal communicated to the latch mechanism 1009 includes a signal that causes the latch mechanism 1009 to disengage the latch element 1020 from the latch interface 1007 to which it is engaged. As shown in FIG. 10E, where a latch element 1020 includes a structure that can protrude from the latch mechanism 1009, the latch element can be retracted at least partially into the latch mechanism 1009 to disengage the latch element 1020 from the latch interface 1007. In some embodiments, where a latch element 1020 is disengaged from a latch interface 1007, the latch mechanism 1009 may cease to exert a force on the computer system 1001 that at least resists a spring force of one or more spring mechanisms. As shown in FIG. 10C, where a latch mechanisms 1009 disengages from a computer system 1001 in the mounting portion 1000, the spring force exerted by the mechanical springs 1006 of the spring mechanisms 1003 can push the computer system 1001 at least partially out of the mounting portion to eject the computer system 1001. The computer system 1001 may be partially ejected from the mounting portion 1000, such that the computer system 1001 protrudes from one or more ends of the mounting portion 1000 and remains structurally supported by the structural elements 1002. A partially ejected computer system 1001 can be more easily identified visually by an operator, who can manually remove the computer system 1001 from the mounting portion 1000.

Figure 11:
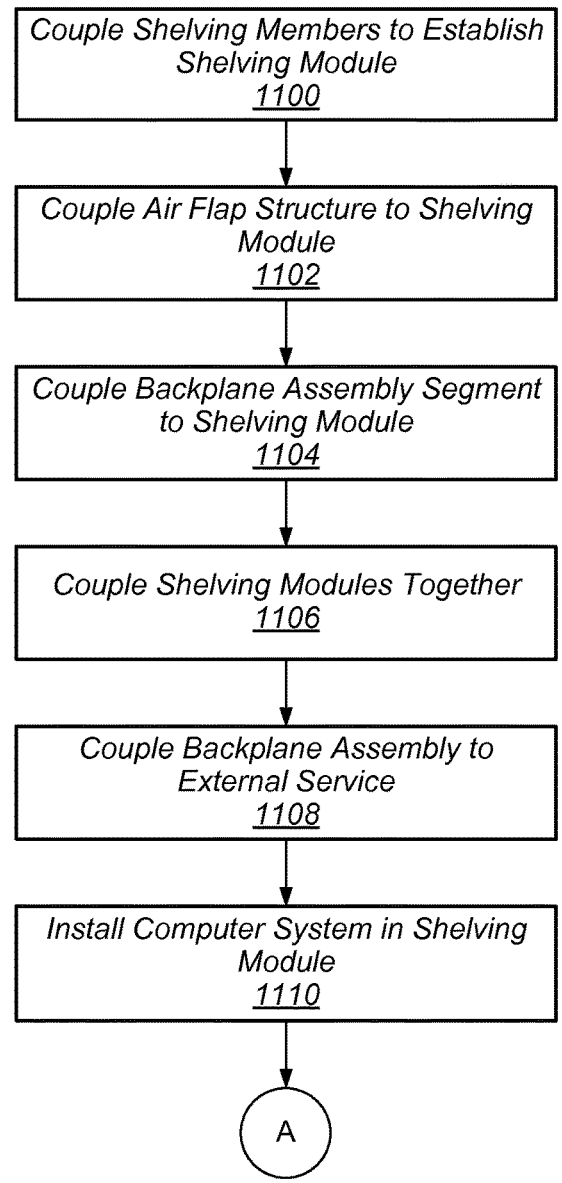
FIG. 11 illustrates configuring shelving module mounting portions, according to some embodiments.

FIG. 11 illustrates configuring shelving module mounting portions according to some embodiments. At 1100, one or more shelving members are coupled to establish a shelving module. For example, where a shelving module at least partially encompasses side, top, and bottom ends of one or more mounting portions, multiple shelving members that each encompass a separate end of the one or more mounting portions can be coupled together to establish the shelving module. In some embodiments, a shelving module encompasses a single mounting portion. In some embodiments, a shelving module encompasses multiple mounting portions. A shelving module can include one or more structural elements, including one or more sets of support rails.

At 1102, one or more air flap structures are coupled to the shelving module. Coupling an air flap structure can include coupling a hinge structure, which can include a single rod structure, to one or more shelving members of the shelving module, such that one or more flap elements of the air flap structure can move between deployed configurations and retracted configurations. In some embodiments, a spring mechanism couples at least a portion of a flap element with a shelving module and exerts a spring force on the flap element to push the flap element into a particular configuration in the absence of one or more countering forces.

At 1104, one or more backplane assembly segments are coupled to the shelving module. In some embodiments, a backplane assembly comprises a single segment, such that coupling a segment to the shelving module comprises coupling the entire backplane assembly to the shelving module.

At 1106, separate shelving modules are coupled together to establish a rack computing system. In some embodiments, separate backplane segments are coupled to separate shelving modules, and a backplane assembly is established based at least in part upon coupling the separate segments together. Separate backplane assembly segments that are coupled to separate shelving modules may be coupled together base at least in part upon a coupling of the separate shelving modules together. For example, separate backplane segments may include complementary connectors, and coupling separate shelving modules together may align and engage complementary connectors of separate backplane assembly segments to couple the separate segments.

At 1108, the backplane assembly is communicatively coupled to an external service system, etc. An external service, system, etc., in some embodiments, can include one or more of a power distribution system, communication network, etc. The backplane assembly can be coupled to the external service via directly coupling with one or more pathways, including power transmission lines, communication pathway conduits, etc., via coupling to an intermediary device, including a network switch device for network communication, some combination thereof, or the like.

At 1110, one or more computer systems are installed in the shelving module. Installing a computer system in a shelving module can include inserting the computer system into a mounting portion of the shelving module to mount the computer system in the mounting portion and communicatively couple the computer with one or more external services, systems, etc. via coupling with one or more backplane assemblies. In some embodiments, where a mounting portion includes at least a backplane segment that includes a connector aligned with a particular portion of the mounting portion, the computer system can be coupled with the backplane via insertion through the mounting portion to couple a corresponding connector on the computer system, including a power connector, communication connector, etc., with the backplane segment connector, which can communicatively couple the computer system with the external services, systems, etc. via the coupled connectors.

Figure 12:
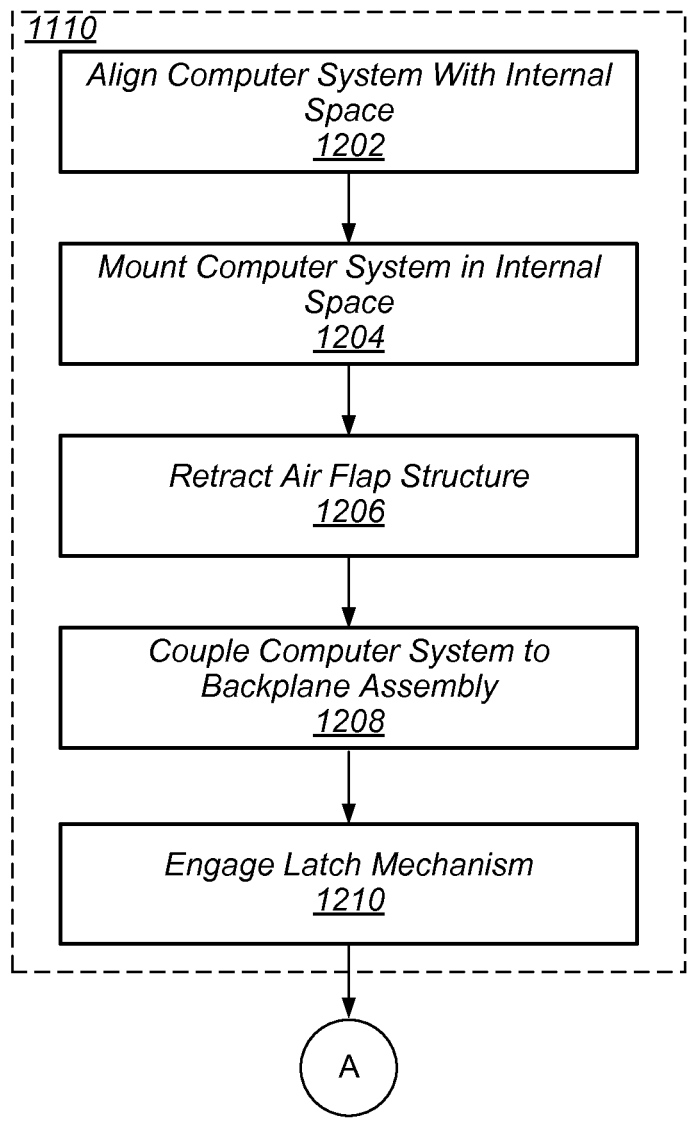
FIG. 12 illustrates installing a computer system in a mounting portion of a shelving module, according to some embodiments.

FIG. 12 illustrates installing 1110 a computer system in a mounting portion of a shelving module, according to some embodiments. The various elements illustrated may at least partially comprise installing the computer system, as illustrated and discussed above with reference to element 1110 of FIG. 11.

At 1202, the computer system is aligned with an internal space of the mounting portion of the shelving module. In some embodiments, where the shelving module includes a single mounting portion, the internal space may comprise a slot space extending from an inlet end of the shelving module to an exhaust end, and the alignment may include aligning the computer system to be inserted into the slot space through one or more of the inlet end, exhaust end, etc. Such insertion can include sliding the computer system into the slot space. In some embodiments, where the shelving module includes multiple mounting portions in a common enclosure space, the internal space may comprise one or more sets of structural elements, including support rails, and the alignment may include aligning the computer system to be inserted into the internal space, supported by one or more sets of support rails, through one or more of the inlet end, exhaust end, etc.

At 1204, the computer system is mounted in the internal space. Mounting a computer system in the internal space may include placing the computer system in contact with one or more structural elements, such that the structural load of the computer system is at least partially transmitted through the shelving module via the structural elements. Mounting a computer system in an internal space can include sliding the computer system through one or more cross-sectional planes extending through the internal space.

At 1206, one or more air flap structures included in the mounting portion are retracted. Where an air flap structure includes a flap element that extends, in a deployed configuration, along a cross-sectional plane extending through the internal space, the air flap structure can be retracted into a retracted configuration based at least in part upon the computer system being inserted at least partially through the cross section, such that a portion of the housing of the computer system pushes at least the flap element out of the cross-sectional plane and into a retracted configuration. Retraction of the air flap structure can enable the computer system to continue being inserted through the internal space of the mounting portion.

At 1208, the computer system is coupled with at least a segment of a backplane assembly. Coupling with a backplane assembly segment can include a connector on one end of the computer system engaging and coupling with a corresponding connector of the backplane assembly segment. The connector of the backplane assembly segment may be arranged on the backplane assembly segment to be aligned with a particular portion of one or more ends of the mounting portion internal space, such that the connector of the backplane assembly segment is in alignment with a corresponding connector of the computer system when the computer system is aligned with the mounting portion internal space and inserted into the internal space to mount the computer system in the mounting portion. In some embodiments, the connectors of the backplane assembly segment and computer system comprise complementary connectors and can include blind mating connectors, where the connectors can be coupled based at least in part upon the computer system being inserted into the internal space until the connector of the computer system comes into contact with the aligned connector of the backplane assembly segment.

In some embodiments, coupling a computer system to a backplane assembly segment includes communicatively coupling the computer system with one or more external systems, services, etc. via at least a portion of the backplane assembly. For example, where the backplane assembly segment is comprised in a backplane assembly that is coupled to a communication network via a network cable connection, coupling the computer system with the backplane assembly segment can include communicatively coupling the computer system with the communication network via at least a portion of the backplane assembly.

At 1210, a latch mechanism is engaged to secure the computer system in the mounting portion. The latch mechanism can include a latch element that engages with a latch interface included in the computer system as the computer system is inserted into the internal space, such that the latch interface moves into alignment with the latch mechanism. In some embodiments, the latch mechanism, when engaged with the computer system, exerts a force on the computer system that resists a spring force of an ejection system, thereby securing the computer system from being at least partially ejected from the mounting portion internal space.

Figure 13:
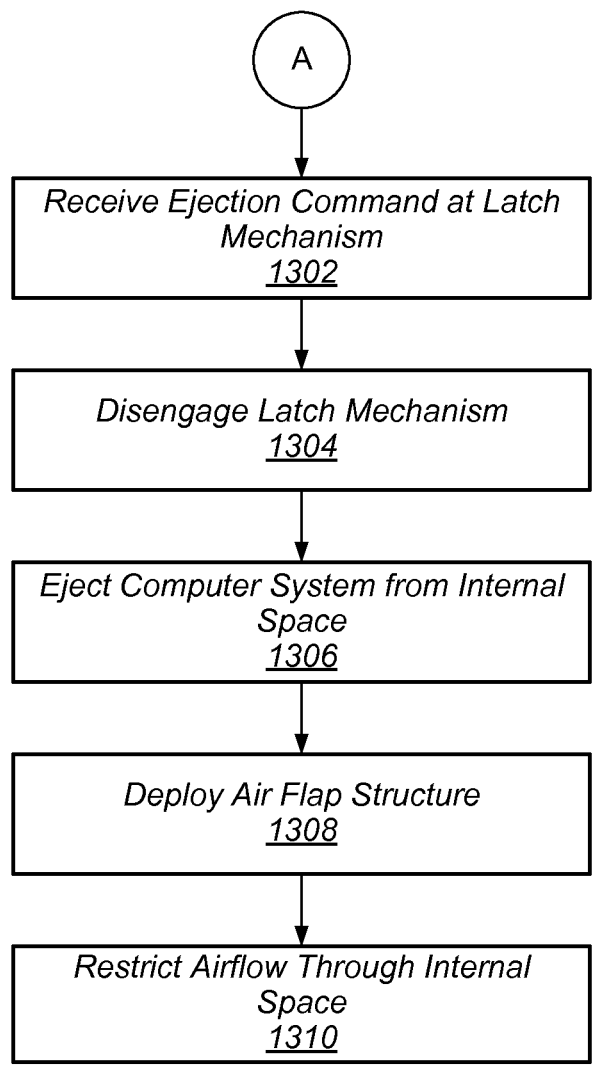
FIG. 13 illustrates uninstalling a computer system from a mounting portion and restricting airflow through a portion of the mounting portion, according to some embodiments.

FIG. 13 illustrates uninstalling a computer system from a mounting portion and restricting airflow through a portion of the mounting portion, according to some embodiments. Uninstalling a computer system from a mounting portion, in some embodiments, includes decoupling the computer system from one or more connectors included in the mounting portion and un-mounting the computer system from one or more structural elements in the mounting portion.

At 1302, an ejection command signal is received at the latch mechanism that is securing the computer system in the mounting portion internal space. The signal may be received from an ejection interface device, which may be coupled to the mounting portion, a shelving module in which the mounting portion is located, etc. In some embodiments, the signal is received from a remote computer system that is external to the shelving module via one or more communication pathways. For example, the ejection command signal may be received based at least in part upon a user command to a remote computer system to eject the computer system. The ejection command signal may be specific to a ejecting a particular computer system from a particular mounting portion.

At 1304, the latch mechanism is disengaged from the computer system. The disengagement may include a solenoid device, retraction of a latch element from being engaged with a latch interface of the computer system, some combination thereof, or the like. Retraction of the latch element from engagement can, in some embodiments, remove a force from being exerted on the computer system to secure the computer system in a particular location in the mounting portion.

At 1306, the computer system is at least partially ejected from the internal space of the mounting portion. The ejection may be based upon exertion of a spring force on at least one end of the computer system by one or more spring mechanisms. In some embodiments, the spring mechanism exerts a spring force on the computer system while the computer system is inserted into and mounted in the mounting portion, where the latch mechanism exerts another force on the computer system that resists the spring force. In some embodiments, where the latch mechanism is disengaged, the spring force is not resisted and pushes the computer system at least partially out of the internal space. In some embodiments, the computer system is partially ejected, where a portion of the computer system protrudes from the mounting portion and the computer system remains structurally supported by one or more structural elements of the mounting portion.

At 1308, the air flap structure is deployed into a deployed configuration in the mounting portion. Where an air flap structure is forced into a refracted configuration based at least in part upon the computer system being mounted in the internal space, a removal of the computer system from the internal space can enable the air flap structure to return to a deployed configuration. In some embodiments, the air flap structure can be deployed into the deployed configuration based at least in part upon a hinge structure, gravitational force that induces a portion of the air flap structure to fall into the internal space in the absence of a countering force, a pressure gradient, a spring mechanism that forces a portion of the air flap structure into the internal space in the absence of a countering force that exceeds the spring force, some combination thereof, or the like.

At 1310, one or more portions of the air flap structure restrict airflow through at least a portion of the mounting portion. In some embodiments, an air flap structure in a deployed configuration extends into the internal space of the mounting portion. In some embodiments, the flap element of an air flap structure in a deployed configuration can extend through a cross section of the internal space, partitioning the internal space and restricting airflow between the partitioned portions. This partitioning by the flap element in the deployed configuration can restrict air from flowing between the inlet end and an exhaust end of the mounting portion that is an opposite end of the internal space from the inlet end. In some embodiments, where air at the inlet end is at a higher pressure than air at the exhaust end, the deployed flap element can restrict airflow from the inlet end to the exhaust end, which can mitigate a bypass of air through a rack computing system in which the mounting portion is included. In some embodiments, where air at the exhaust end is at a higher pressure than air at the inlet end, the deployed flap element can restrict airflow from the exhaust end to the inlet end, which can mitigate a recirculation of exhaust air through a rack computing system.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center comprising:
   a rack comprising a plurality of mounting portions that are each configured to receive and structurally support at least one of a plurality of computer systems mounted in the respective one of the plurality of mounting portions;
   a backplane assembly that is communicatively coupled to a communication network and extends along a portion of a rear end of the rack, the backplane assembly comprising separate network connectors that are each aligned with separate ones of the plurality of mounting portions and are each configured to communicatively couple a complimentary network connector of individual ones of the plurality of computer systems with the communication network when the individual ones of the plurality of computer systems are mounted in the separate ones of the plurality of mounting portions; and
   a plurality of air flap structures, each coupled to a separate one of the plurality of mounting portions of the rack and configured to restrict airflow through the respective mounting portion based at least in part upon an absence of a computer system in the respective mounting portion;
   wherein at least one of the mounting portions comprises a latch mechanism configured to:
      receive, at a communication interface of the latch mechanism, an ejection command signal via a communication pathway external to a computer system mounted in the at least one mounting portion; and
      in response to receiving the ejection command signal, disengage the latch mechanism with an interface portion of the computer system.

2. The data center of claim 1, wherein:
at least one of the plurality of mounting portions is included in a shelving module, wherein the shelving module comprises:
   a coupling element configured to directly couple the shelving module to the rack, wherein the backplane assembly extends at least in part along a portion of a rear end of the shelving module;
   a housing configured to at least partially encompass a slot and to receive at least one of the plurality of computer systems into the slot via a front end of the shelving module opposite the rear end of the shelving module in which the backplane assembly extends at least in part along, such that the at least one of the plurality of computer systems is mounted in the shelving module; and
wherein, to restrict airflow through the respective mounting portion based at least in part upon an absence of a computer system in the respective mounting portion, the at least one of the air flap structures is configured to substantially seal a cross section of the slot substantially perpendicular to a depth of the slot through the shelving module, based at least in part upon an absence of a computer system in the slot, to restrict air flow through the depth of the slot through the shelving module.

3. The data center of claim 1, wherein:
the plurality of mounting portions are included in a shelving module, wherein the shelving module comprises:
   an enclosure including a front end, side ends, and a rear end, wherein each of the plurality of mounting portions comprises a portion of the enclosure; and
   a plurality of sets of support rails coupled to the side ends of the enclosure, wherein each set of support rails is aligned with a separate one of the plurality of mounting portions in the rack and is configured to structurally support at least one computer system mounted in the respective mounting portion of the rack; and
wherein, to restrict airflow through the respective mounting portion based at least in part upon an absence of a computer system in the respective mounting portion, the at least one of the air flap structures is configured to substantially seal a portion of the front end of the enclosure that corresponds with a front end of the respective mounting portion, based at least in part upon an absence of a computer system in the mounting portion, to restrict air flow through the mounting portion between the front end of the enclosure and the rear end of the enclosure.

4. The data center of claim 1, wherein the latch mechanism is configured to reversibly engage with the interface portion of the computer system to hold the computer system in the at least one mounting portion and to resist the spring force exerted on the rear end of the computer system, the at least one of the mounting portion further comprising:
   a spring mechanism configured to exert a spring force on a rear end of the computer system mounted in the at least one mounting portion;
   wherein the spring mechanism is further configured to at least partially eject the computer system from the mounting portion based at least in part upon the latch mechanism being disengaged with the interface portion of the computer system, wherein to at least partially eject the computer system, the spring mechanism is configured to exert the spring force on the rear end of the computer system to push an opposite front end of the computer system out of the mounting portion.

5. An apparatus, comprising:
a shelving module configured to mount in a rack and support one or more computer systems in the rack, the shelving module comprising:
   a backplane assembly that is communicatively coupled to a communication network and extends at least in part along a portion of a rear end of the shelving module;
   two or more shelving members configurable to form at least one slot for receiving, from a front end of the shelving module opposite the rear end of the shelving module in which the backplane assembly extends at least in part along a portion of, at least one of the one or more computer systems to mount the at least one computer system in the shelving module;
   an air flap structure coupled to at least one of the two or more shelving members and configurable to restrict airflow through the at least one slot based at least in part upon an absence of a computer system in the at least one slot, wherein, to restrict airflow through the at least one slot, the air flap structure is configured to substantially seal a cross section of the at least one slot substantially perpendicular to a depth of the at least one slot through the shelving module; and
   a latch mechanism configured to:
      receive, at a communication interface of the latch mechanism, an ejection command signal via a communication pathway external to the at least one computer system mounted in the at least one slot; and
      in response to receiving the ejection command signal, disengage the latch mechanism with an interface portion of the at least one computer system.

6. The apparatus of claim 5,
the backplane assembly comprising:
   at least one backplane network connector aligned with at least a portion of the rear end of the shelving module and configured to communicatively couple at least one computer system mounted in the at least one slot with the communication network.

7. The apparatus of claim 6, wherein:
the at least one backplane network connector that is aligned with at least a portion of the rear end of the shelving module is a blind mate backplane connector configured to couple with a complementary blind mate computer system connector of the at least one computer system mounted in the at least one slot.

8. The apparatus of claim 6, wherein:
the backplane assembly comprises at least one backplane connector configured to couple the backplane assembly with at least one other backplane assembly, such that the backplane assembly is communicatively coupled with the communication network via the at least one other backplane assembly; and
the shelving module comprises a complementary coupling element configured to couple the shelving module with another shelving module, such that the backplane assembly of the shelving module is coupled in series with another backplane assembly of the other shelving module to assemble a combined backplane assembly.

9. The apparatus of claim 5, wherein the air flap structure further comprises:

a spring mechanism configured to exert a spring force to substantially seal the cross section of the at least one slot.

10. The apparatus of claim 5, wherein the latch mechanism is configured to reversibly engage with an interface portion of the at least one computer system mounted in the at least one slot to hold the at least one computer system in the at least one slot and to resist the spring force exerted on the rear end of the at least one computer system, and wherein the shelving module further comprises:
  a spring mechanism configured to exert a spring force on a rear end of the at least one computer system mounted in the at least one slot;
  wherein the spring mechanism is further configured to at least partially eject the at least one computer system from the at least one slot based at least in part upon the latch mechanism being disengaged with the interface portion of the at least one computer system, wherein to at least partially eject the at least one computer system, the spring mechanism is configured to exert the spring force on the rear end of the at least one computer system to push an opposite front end of the at least one computer system out of the at least one slot.

11. The apparatus of claim 10, wherein the shelving module further comprises:
  an ejection interface communicatively coupled to the latch mechanism and configured to command the latch mechanism to disengage with the interface portion of the at least one computer system mounted in the at least one slot based at least in part upon a user-initiated interaction with the ejection interface.

12. The apparatus of claim 11, wherein the latch mechanism is configured to:
  receive, at the latch mechanism, the command to disengage with the interface portion of the at least one computer system mounted in the at least one slot via a communication pathway external to the at least one computer system.

13. The apparatus of claim 5, wherein the shelving module comprises:
  two or more shelving members configurable to form an enclosure comprising a plurality of mounting portions, wherein the enclosure is configured to receive each of multiple computer systems into separate mounting portions of the plurality of mounting portions to mount the one or more computer systems in the shelving module;
  a plurality of sets of support rails, each configured to structurally support at least one computer system mounted in a separate mounting portion of the plurality of mounting portions in the enclosure, wherein at least one support rail in each set of support rails is coupled to a separate one of the two or more shelving members at an elevation corresponding to the separate mounting portion of the plurality of mounting portions; and
  wherein, to restrict airflow through the at least one slot, the air flap structure is configured to substantially seal a portion of a front end of the enclosure that corresponds with a front end of the separate mounting portion of the plurality of mounting portions, based at least in part upon an absence of a computer system in the separate mounting portion, to restrict air flow through the separate mounting portion of the plurality of mounting portions between the front end of the enclosure and a rear end of the enclosure.

14. A method comprising:
  providing a shelving module to mount in a rack to configure the rack to support at least one computer system, wherein providing the shelving module comprises coupling at least two shelving members to form at least one slot for receiving the at least one computer system to mount the at least one computer system in the shelving module;
  coupling at least one backplane assembly, the at least one backplane assembly comprising at least one network connector, to a rear end of the shelving module;
  configuring the shelving module to at least partially eject the at least one computer system from the at least one slot, wherein configuring the shelving module to at least partially eject the at least one computer system from the at least one slot comprises coupling a latch mechanism to the shelving module, wherein the latch mechanism is configured to disengage the latch mechanism with an interface portion of the at least one computer system in response to reception, at a communication interface of the latch mechanism, of an ejection command signal via a communication pathway external to the at least one computer system; and
  configuring the shelving module to restrict airflow through the at least one slot between a front end of the rack and a rear end of the rack based at least in part upon an absence of the at least one computer system in the at least one slot;
  wherein configuring the shelving module to restrict airflow through the at least one slot between the front end of the rack and the rear end of the rack based at least in part upon an absence of the at least one computer system in the at least one slot comprises coupling an air flap structure to at least one of the two or more shelving members, wherein the air flap structure comprises at least one flap element configurable to substantially seal a cross section of the at least one slot substantially perpendicular to a depth of the at least one slot through the shelving module between the front end of the rack and the rear end of the rack.

15. The method of claim 14, wherein:
  providing the shelving module comprises coupling at least two shelving members to form at least one slot for receiving a plurality of computer systems to mount each of the plurality of computer systems in separate mounting portions of the at least one slot;
  providing the shelving module further comprises coupling multiple sets of support rails to the at least two shelving members, wherein each set of support rails comprises at least two support rails that are each coupled to a separate one of the at least two shelving members and are aligned with a particular mounting portion of the separate mounting portions of the at least one slot, wherein each set of support rails is configured to structurally support a computer system mounted in a respective one of the separate mounting portions of the at least one slot; and
  configuring the shelving module to restrict airflow through the at least one slot between the front end of the rack and the rear end of the rack based at least in part upon an absence of a computer system in the at least one slot comprises coupling the air flap structure to at least one of the two or more shelving members at an elevation in the at least one slot corresponding to a particular mounting portion, wherein the air flap structure comprises at least one flap element configurable to substantially seal a cross section of a front end of the particular mounting portion substantially perpendicular to a depth of the particular mounting portion through the shelving module between the front end of the rack and the rear end of the rack.

16. The method of claim 14, wherein:
providing the shelving module comprises providing a plurality of shelving modules in the rack, wherein each of the plurality of shelving modules comprises a backplane assembly configured to couple with a network connector of a computer system mounted in the at least one slot of the shelving module, wherein providing the plurality of shelving modules comprises:
coupling each of the plurality of shelving modules to at least one other of the plurality of shelving modules to establish a shelving module assembly configured to support a plurality of shelving modules in the plurality of shelving modules; and
coupling each of the backplane assemblies of the plurality of shelving modules to at least one other backplane assembly of at least one other of the plurality of shelving modules to establish a combined backplane assembly that communicatively couples each of the plurality of computer systems mounted in slots of the plurality of shelving modules to a communication network via coupling of each of the plurality of computer systems to respective backplane network connectors of the respective backplane assembly of the respective shelving module into which the respective one of the plurality of computer systems is mounted.

17. The method of claim 14, wherein the at least one network connector of the at least one backplane assembly is aligned to couple with a computer system of the plurality of computer systems mounted in the at least one slot of the shelving module, and further comprising:
configuring the at least one backplane assembly to communicatively couple the computer system of the plurality of computer systems mounted in the at least one slot of the shelving module to a communication network, wherein configuring the at least one backplane assembly to communicatively couple the computer system to the communication network comprises communicatively coupling the at least one backplane assembly to the communications network and coupling the network connector of the at least one backplane assembly to a complementary network connector of the computer system mounted in the at least one slot.

18. The method of claim 14, wherein:
the at least one flap element of the air flap structure is configured to protrude into the at least one slot, in the absence of a computer system in the at least one slot, to a sealing configuration that substantially seals the cross section of the at least one slot; and
the at least one flap element of the air flap structure is configured to be pushed, by a computer system in the at least one slot, to a resting configuration that lies at least partially flush with the mounted computer system and enables the computer system to occupy at least a portion of the at least one slot that extends through the cross section of the at least one slot.

19. The method of claim 14,
wherein the latch mechanism is configured to reversibly engage with an interface portion of the mounted computer system to hold the mounted computer system in the at least one slot and to resist a spring force exerted on a rear end of the mounted computer system, and wherein configuring the shelving module to at least partially eject the mounted computer system from the at least one slot further comprises:
coupling a spring mechanism to a rear end of the shelving module, wherein the spring mechanism is configured to exert the spring force on the rear end of the mounted computer system;
wherein, to at least partially eject the mounted computer system from the at least one slot, the spring mechanism is configured to exert the spring force on the rear end of the at least one computer system to push an opposite front end of the at least one computer system out of the at least one slot, based at least in part upon the latch mechanism being disengaged with the interface portion of the at least one computer system.

20. The method of claim 19, wherein configuring the shelving module to at least partially eject the mounted computer system from the at least one slot further comprises:
communicatively coupling an ejection interface to the latch mechanism, wherein the ejection interface is configured to command the latch mechanism to disengage with the interface portion of the mounted computer system based at least in part upon a user-initiated interaction with the ejection interface.

* * * * *